(12) United States Patent
Barron et al.

(10) Patent No.: US 9,124,095 B1
(45) Date of Patent: Sep. 1, 2015

(54) ISLANDING DETECTION IN POWER CONVERTERS

(71) Applicant: Ideal Power, Inc., Spicewood, TX (US)

(72) Inventors: Guy Michael Barron, Spicewood, TX (US); William C. Alexander, Spicewood, TX (US)

(73) Assignee: Ideal Power Inc., Austin, TX (US)

(*) Notice: Subject to any disclaimer, the term of this patent is extended or adjusted under 35 U.S.C. 154(b) by 0 days.

(21) Appl. No.: 14/183,403

(22) Filed: Feb. 18, 2014

Related U.S. Application Data

(60) Provisional application No. 61/765,131, filed on Feb. 15, 2013.

(51) Int. Cl.
*H02H 3/00* (2006.01)
*H02H 11/00* (2006.01)
*H02H 7/122* (2006.01)

(52) U.S. Cl.
CPC .............. *H02H 11/00* (2013.01); *H02H 7/122* (2013.01)

(58) Field of Classification Search
CPC ................................................ H03K 17/0822
USPC .......................................................... 361/18
See application file for complete search history.

(56) References Cited

U.S. PATENT DOCUMENTS

| | | | |
|---|---|---|---|
| 6,603,290 B2 * | 8/2003 | Hochgraf | 322/37 |
| 7,248,946 B2 * | 7/2007 | Bashaw et al. | 700/286 |
| 7,304,403 B2 * | 12/2007 | Xu | 307/84 |
| 7,599,196 B2 | 10/2009 | Alexander | |
| 7,778,045 B2 | 8/2010 | Alexander | |
| 7,843,082 B2 * | 11/2010 | Chou et al. | 307/64 |
| 8,295,069 B2 | 10/2012 | Alexander | |
| 8,300,426 B2 | 10/2012 | Alexander | |
| 8,345,452 B2 | 1/2013 | Alexander | |
| 8,391,033 B2 | 3/2013 | Alexander | |
| 8,395,910 B2 | 3/2013 | Alexander | |
| 8,400,800 B2 | 3/2013 | Alexander | |
| 8,406,265 B2 | 3/2013 | Sabathil et al. | |
| 2008/0204044 A1 | 8/2008 | Ponnaluri et al. | |
| 2012/0013376 A1 | 1/2012 | Thacker et al. | |
| 2012/0051100 A1 | 3/2012 | Alexander | |
| 2012/0268975 A1 | 10/2012 | Alexander | |
| 2012/0274138 A1 | 11/2012 | Bundschuh et al. | |
| 2012/0279567 A1 | 11/2012 | Alexander | |
| 2013/0038129 A1 | 2/2013 | Bundschuh et al. | |

* cited by examiner

*Primary Examiner* — Stephen W Jackson
(74) *Attorney, Agent, or Firm* — Robert O. Groover, III; Gwendolyn S.S. Grover; John A. Thomas

(57) ABSTRACT

Methods and systems for islanding detection in power generators, particularly power converters. The present innovative methods can disconnect the power converter from the power distribution grid. Islanding detection can be performed by detecting the difference in resistive impedance between the islanded and un-islanded conditions, using an input-output power and input-output voltage correlation technique. The present methods can shut down the power converter instead of allowing it to continue running without connection to the grid, which will protect line-worker safety.

10 Claims, 33 Drawing Sheets

Three Phase Power Converter

Inductor/Capacitor Voltage Ramping between Modes

Capacitor Ramping – Between each of Modes 5 - 1

Three Phase Power Converter

Inductor Charging – min input line-line, reverse inductor current $V_{a-b} < 0$

Current Switching – Mode 6 of 8

Three Phase Power Converter

Inductor Dis-charging – min output line-line, reverse inductor current $V_{a-b} > 0$ Current Switching – Mode 7 of 8

ISLANDING DETECTION IN POWER CONVERTERS

CROSS-REFERENCE

Priority is claimed from 61/765,131 filed Feb. 15, 2013, which is hereby incorporated by reference.

BACKGROUND

The present application relates to power generators and converters connected to power distribution grids and, more particularly, to detection of the disconnection between a power converter and the power distribution grid.

Note that the points discussed below may reflect the hindsight gained from the disclosed inventions, and are not necessarily admitted to be prior art.

A new kind of power converter was disclosed in U.S. Pat. No. 7,599,196 entitled "Universal power conversion methods," which is incorporated by reference into the present application in its entirety. This patent describes a bidirectional (or multidirectional) power converter which pumps power into and out of a link inductor which is shunted by a capacitor.

The switch arrays at the ports are operated to achieve zero-voltage switching by totally isolating the link inductor+ capacitor combination at times when its voltage is desired to be changed. (When the inductor+capacitor combination is isolated at such times, the inductor's current will change the voltage of the capacitor, as in a resonant circuit. This can even change the sign of the voltage, without loss of energy.) This architecture has subsequently been referred to as a "current-modulating" or "Power Packet Switching" architecture. Bidirectional power switches are used to provide a full bipolar (reversible) connection from each of multiple lines, at each port, to the rails connected to the link inductor and its capacitor. The basic operation of this architecture is shown, in the context of the three-phase to three-phase example of patent FIG. 1, in the sequence of drawings from patent FIG. 12a to patent FIG. 12j.

The ports of this converter can be AC or DC, and will normally be bidirectional (at least for AC ports). Individual lines of each port are each connected to a "phase leg," i.e. a pair of switches which permit that line to be connected to either of two "rails" (i.e. the two conductors which are connected to the two ends of the link inductor). It is important to note that these switches are bidirectional, so that there are four current flows possible in each phase leg: the line can source current to either rail, or can sink current from either rail.

Many different improvements and variations are shown in the basic patent. For example, variable-frequency drive is shown (for controlling a three-phase motor from a three-phase power line), DC and single-phase ports are shown (patent FIG. 21), as well as three- and four-port systems, applications to photovoltaic systems (patent FIG. 23), applications to Hybrid Electric vehicles (patent FIG. 24), applications to power conditioning (patent FIG. 29), half-bridge configurations (patent FIGS. 25 and 26), systems where a transformer is included (to segment the rails, and allow different operating voltages at different ports) (patent FIG. 22), and power combining (patent FIG. 28).

Improvements and modifications of this basic architecture have also been disclosed in U.S. Pat. Nos. 8,391,033, 8,295,069, 8,531,858, and 8,461,718, all of which are hereby incorporated by reference.

The term "converter" has sometimes been used to refer specifically to DC-to-DC converters, as distinct from DC-AC "inverters" and/or AC-AC frequency-changing "cycloconverters." However, in the present application the word converter is used more generally, to refer to all of these types and more, and especially to converters using a current-modulating or power-packet-switching architecture.

Islanding detection refers to detection of the disconnection of a power generator or converter from power distribution grids, when the power converter is still powered. Generally, power converters can still be running even if the external connection to the distribution grid can have been severed. This type of islanding can cause injuries to an electric utility repairman since the circuit can still be powered. Islanding events must be quickly and reliably detected. Standards for such detection, notably IEEE-1S47.2003, which requires islanding event detection to be achieved, have been promulgated in the interest of safety of maintenance personnel and to avoid damage to the network, grid or various loads that can be connected to portions of the grid or network. Therefore, there is a need for islanding detection that can quickly and reliably shut down the power converter when external connection to power distribution grid is lost.

SUMMARY

The present application teaches methods for islanding detection between a power converter and a power distribution grid.

Islanding can be detected by the presence of higher or lower voltage conditions or frequency conditions in the distribution grid. The process starts by determining when voltage drastically changes in the power distribution grid where an inverter can be connected. Thus, by synchronizing a maximum power point tracking (MPPT) algorithm from the inverter to the calculation of DC power and AC voltages, it is possible to determine if islanding from the power distribution grid has occurred.

The disclosed innovations, in various embodiments, provide one or more of at least the following advantages. However, not all of these advantages result from every one of the innovations disclosed, and this list of advantages does not limit the various claimed inventions.

Avoids circuit damage when sudden voltage changes occur in the power distribution grid.

Improves protection for line worker safety.

BRIEF DESCRIPTION OF THE DRAWINGS

The disclosed inventions will be described with reference to the accompanying drawings, which show important sample embodiments and which are incorporated in the specification hereof by reference, wherein:

FIG. 3AA shows a sample embodiment in a single phase to three phase synchronous motor drive.

FIG. 3BB shows a sample embodiment with dual, parallel, "power modules", each of which consists of 12 bi-directional switches and a parallel inductor/capacitor. More than two power modules may of course be used for additional options in multiway conversion.

FIG. 3CC shows an embodiment of the present inventions as a three phase Power Line Conditioner, in which role it can act as an Active Filter and/or supply or absorb reactive power to control the power factor on the utility lines.

FIG. 3DD shows a sample schematic of a microgrid embodiment.

FIG. 3EE shows another sample embodiment of a microgrid.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

Figure 3A:
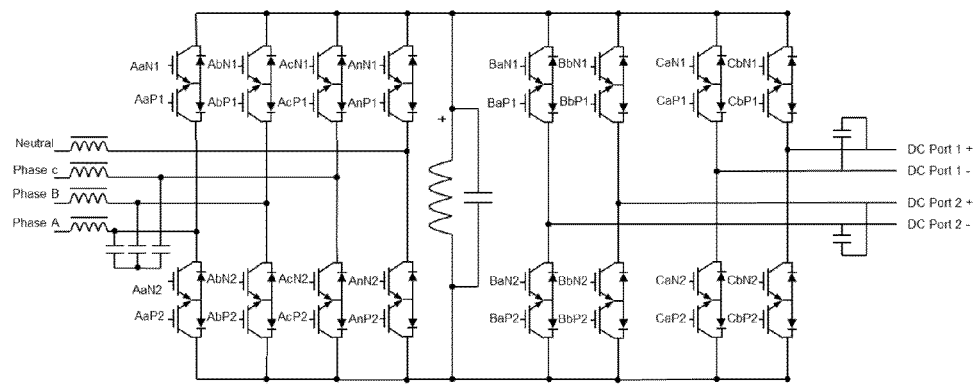
FIG. 3A shows a simplified schematic of a sample power converter.
Figure 3B:
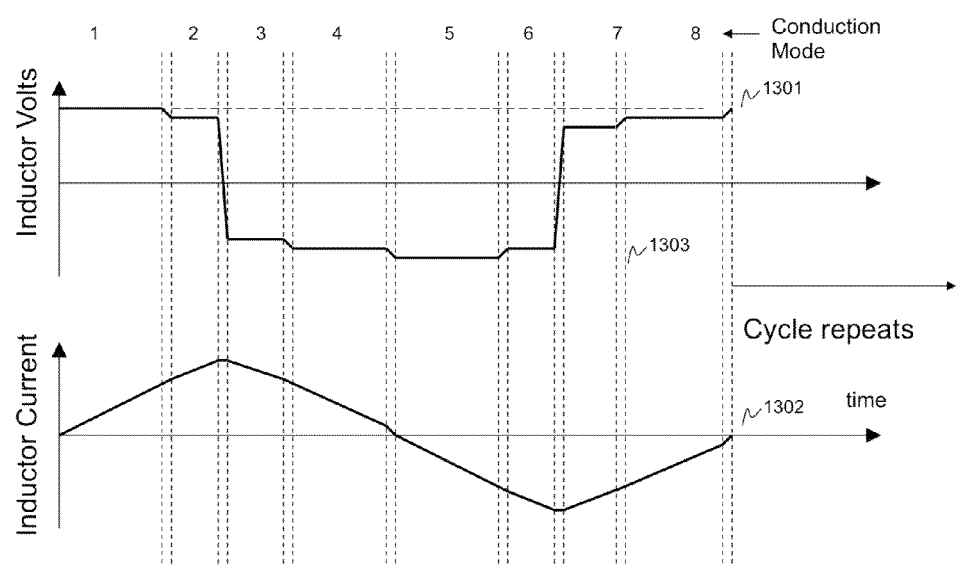
FIG. 3B shows sample voltage and current waveforms for a power cycle of a sample power converter.
Figure 3C:
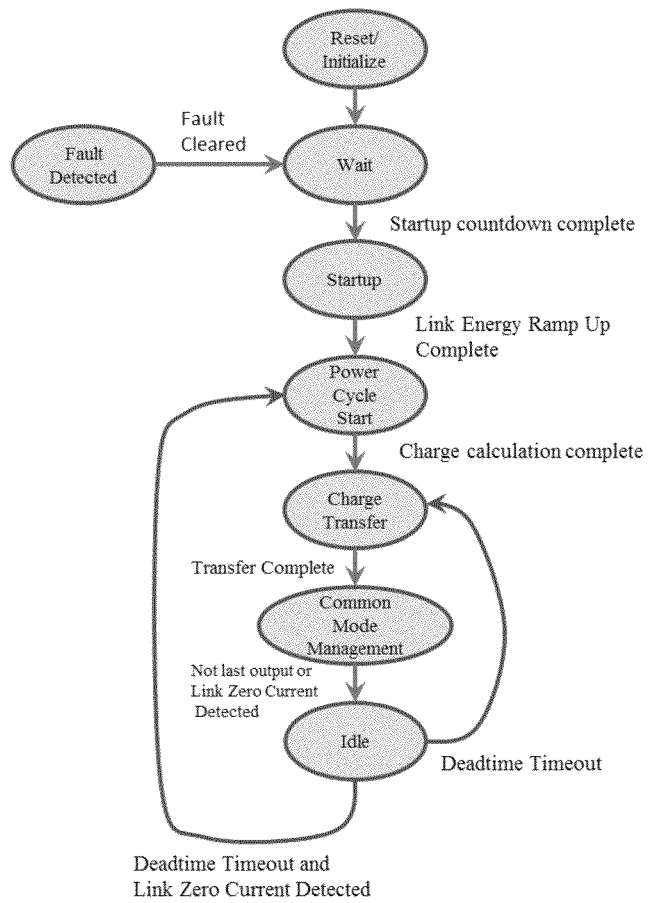
FIG. 3C shows an exemplary finite state machine for one sample control architecture.
Figure 3D:
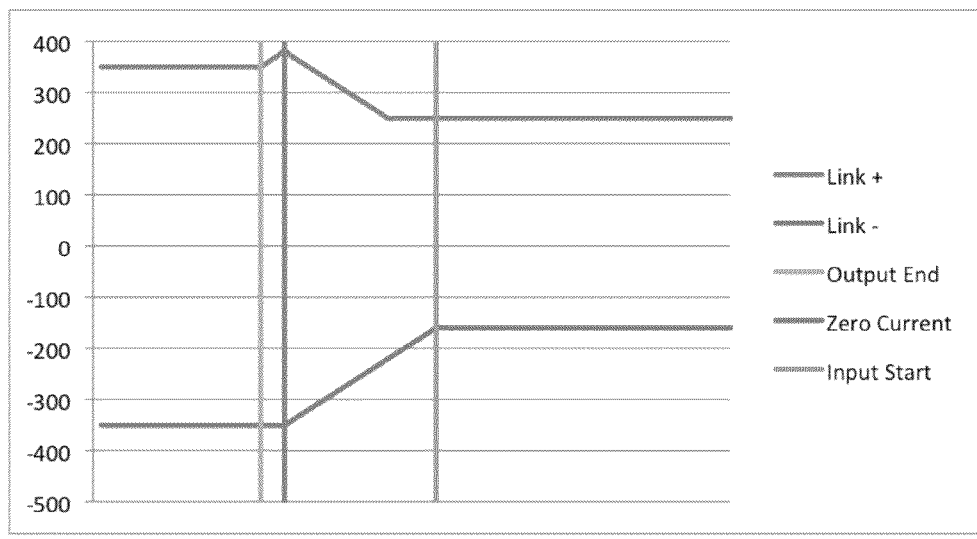
FIGS. 3D, 3E, and 3F show sample embodiments of output and input voltages.
Figure 3E:
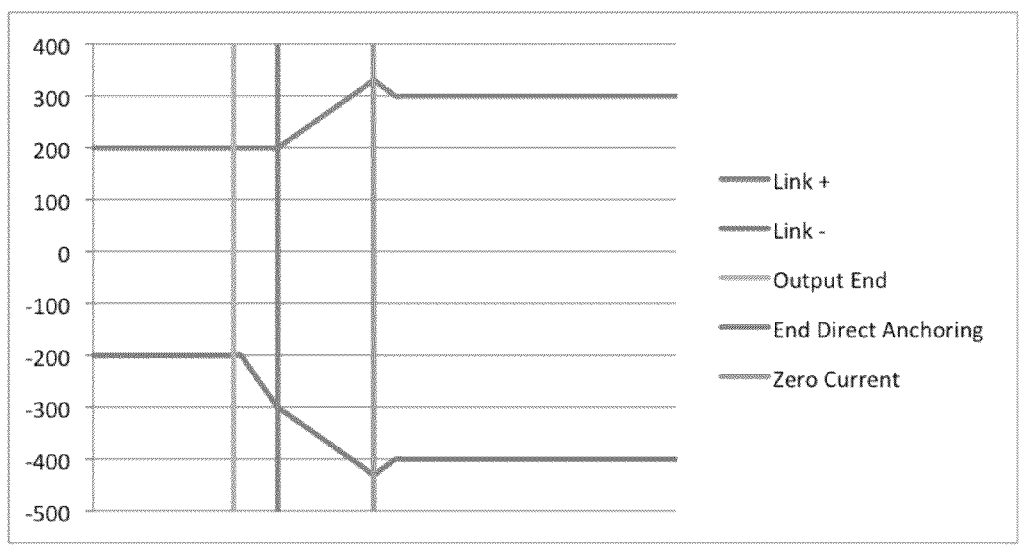
Figure 3F:
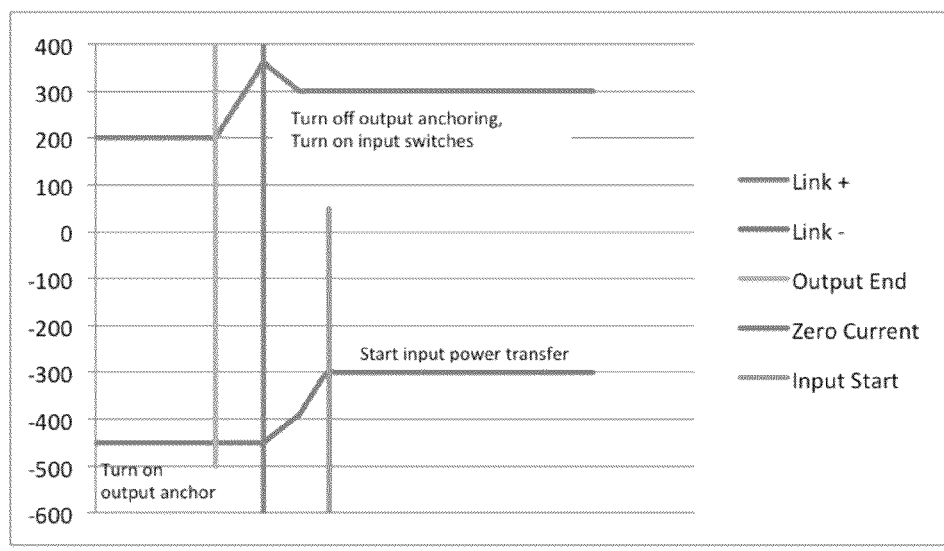
Figure 3G:
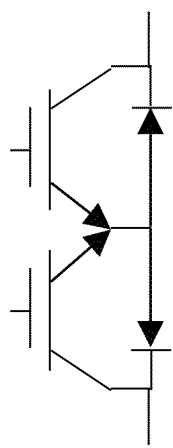
FIG. 3G shows one sample embodiment of a bidirectional switch.
Figure 3H:
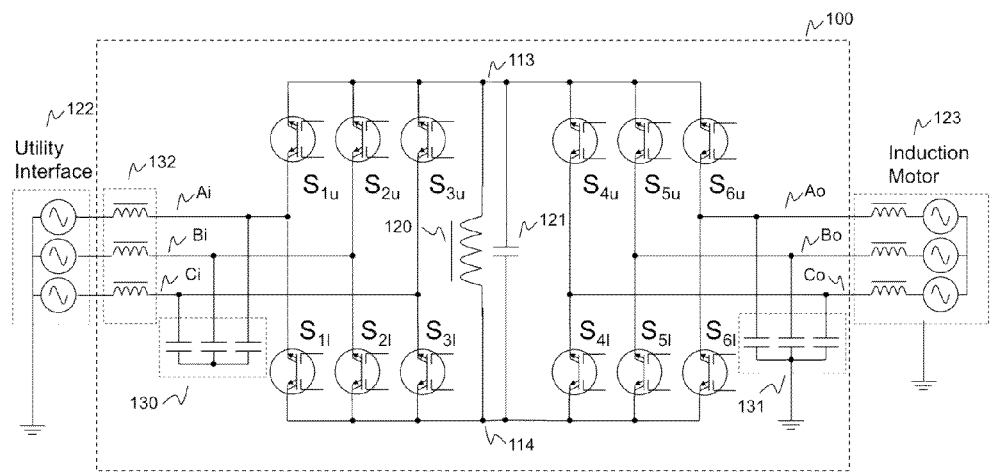
FIG. 3H shows one sample embodiment of a bidirectional current-modulating power converter.

Referring initially to FIG. 3H, illustrated is a schematic of a sample three phase converter 100 that embodies the present inventions. The converter 100 is connected to a first and second power portals 122 and 123 each of which can source or sink power, and each with a port for each phase of the portal. Converter 100 can transfer electric power between said portals while accommodating a wide range of voltages, current levels, power factors, and frequencies between the portals.

Figure 3I:
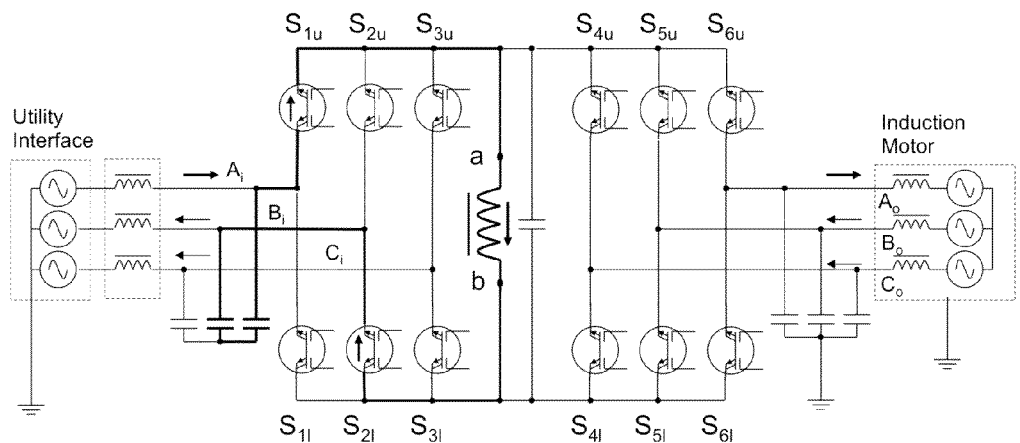
FIGS. 3I, 3J, 3K, 3L, 3M, 3N, 3O, 3P, 3Q, and 3R show sample voltage and current waveforms on an inductor during a typical cycle while transferring power at full load from input to output.
Figure 3J:
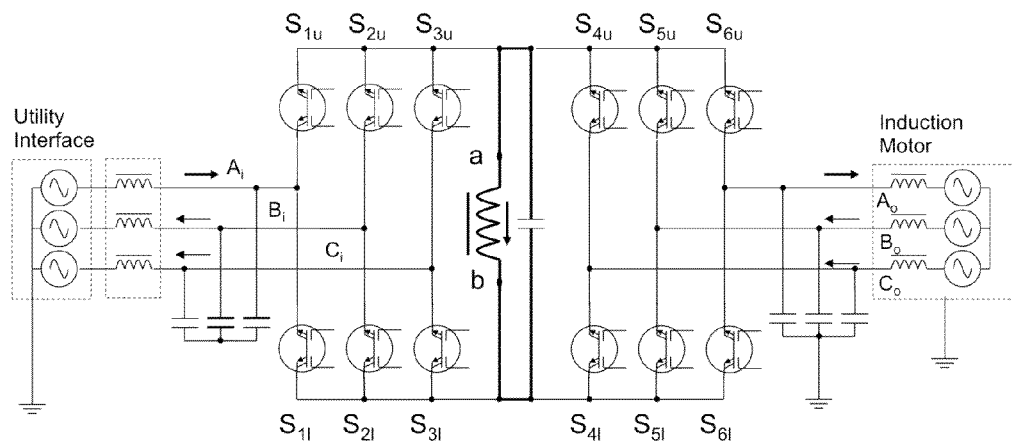
Figure 3K:
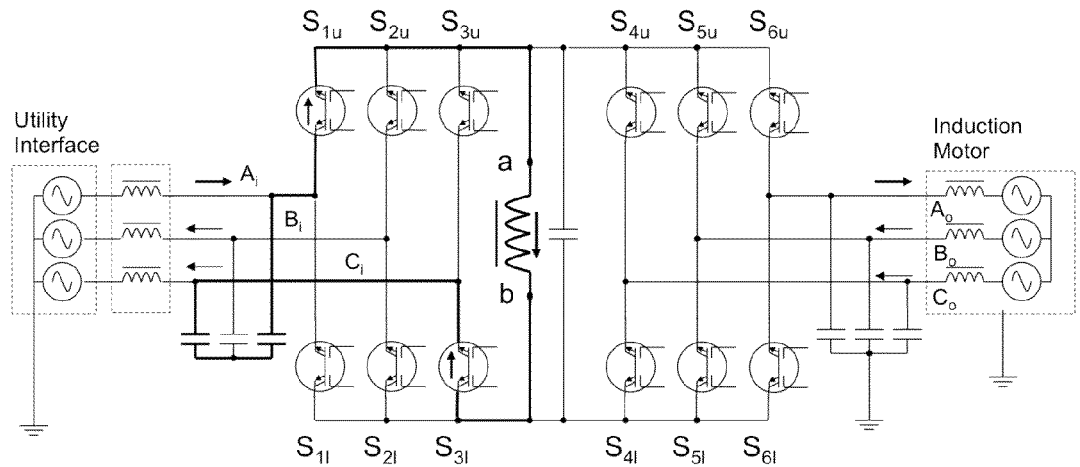
Figure 3L:
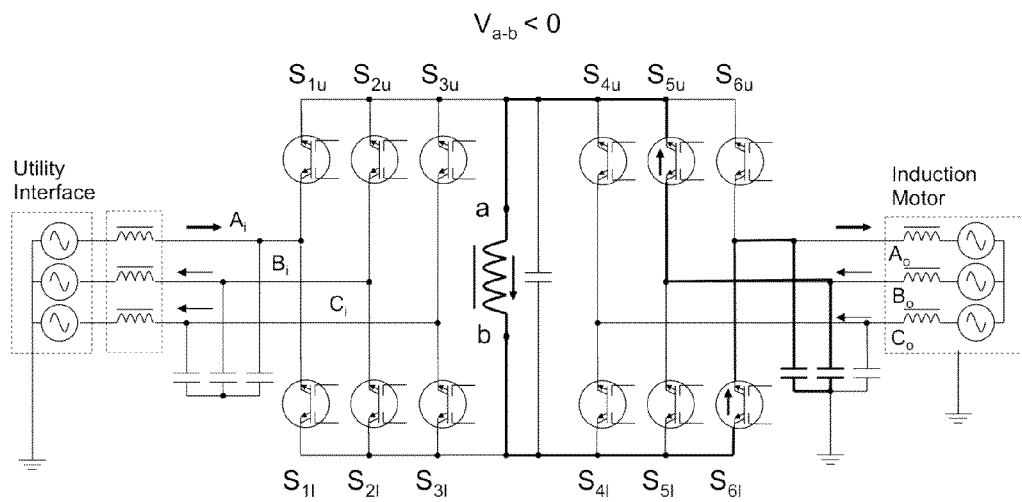
Figure 3M:
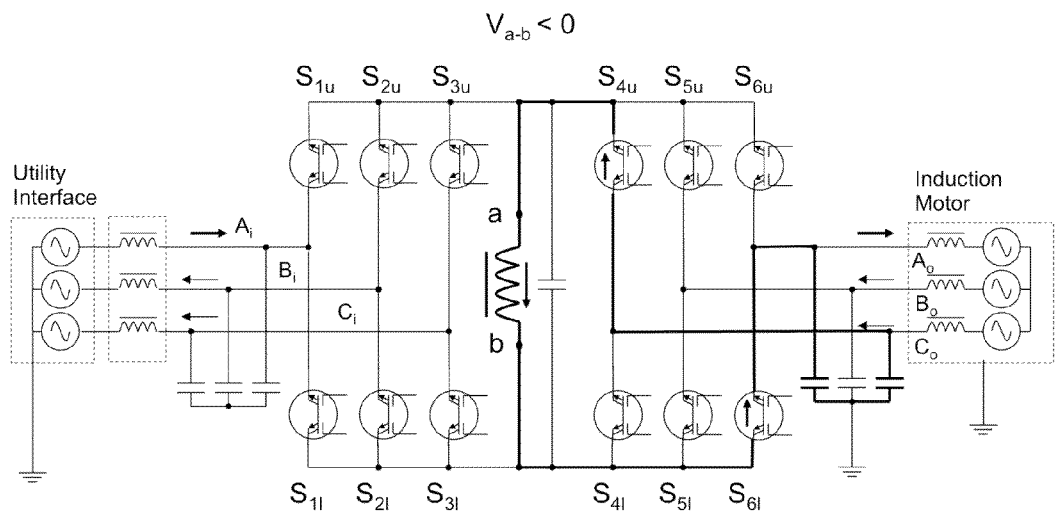
Figure 3N:
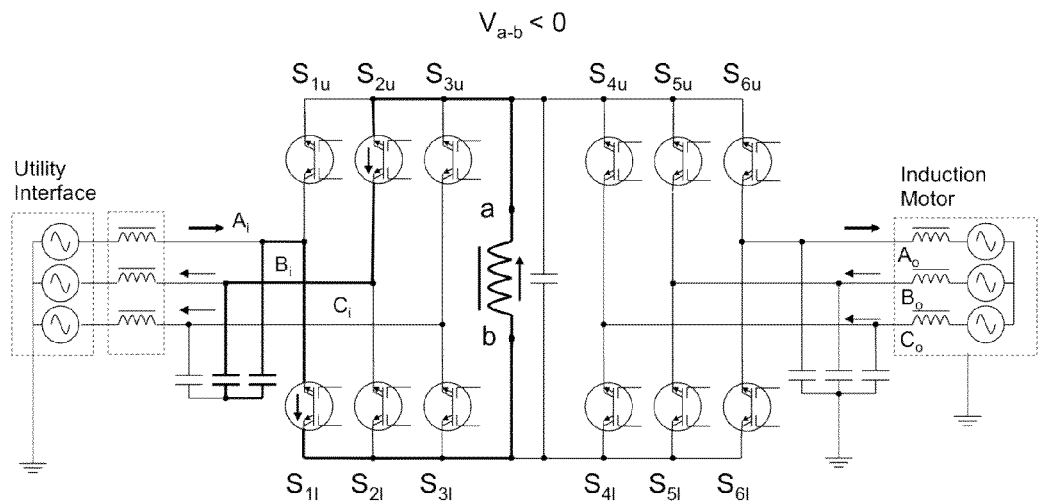
Figure 3O:
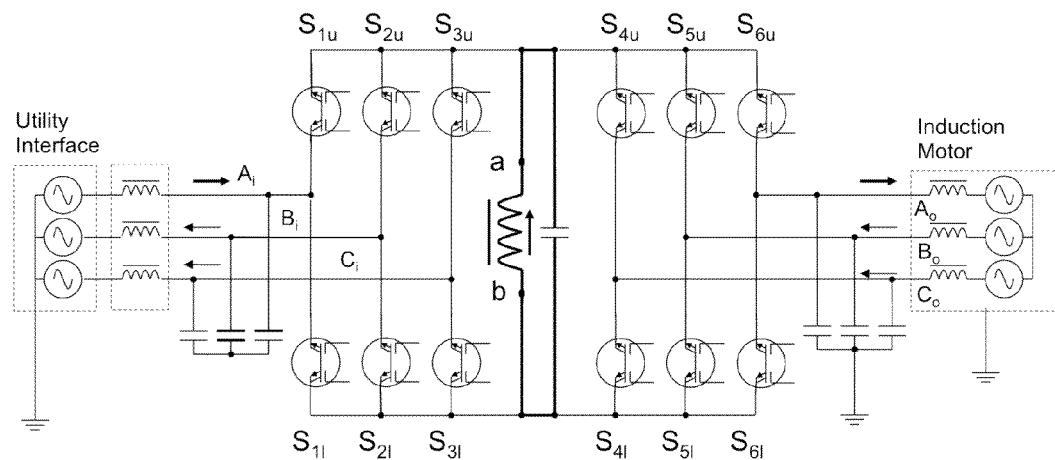
Figure 3P:
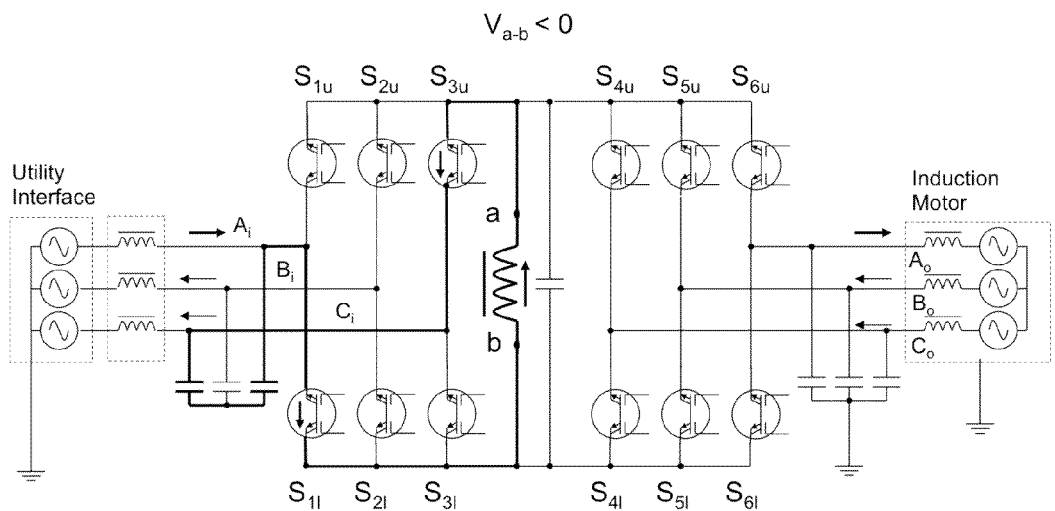
Figure 3Q:
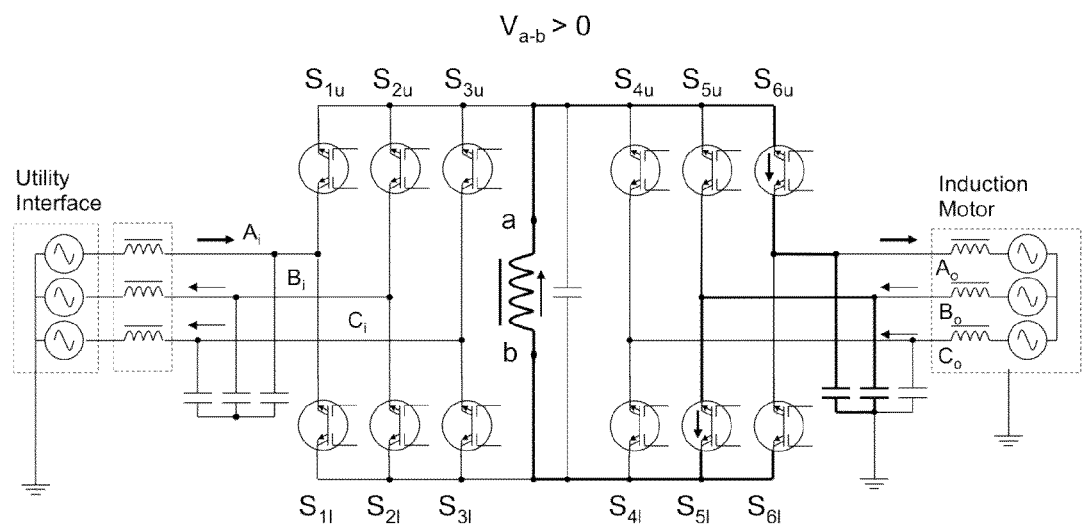
Figure 3R:
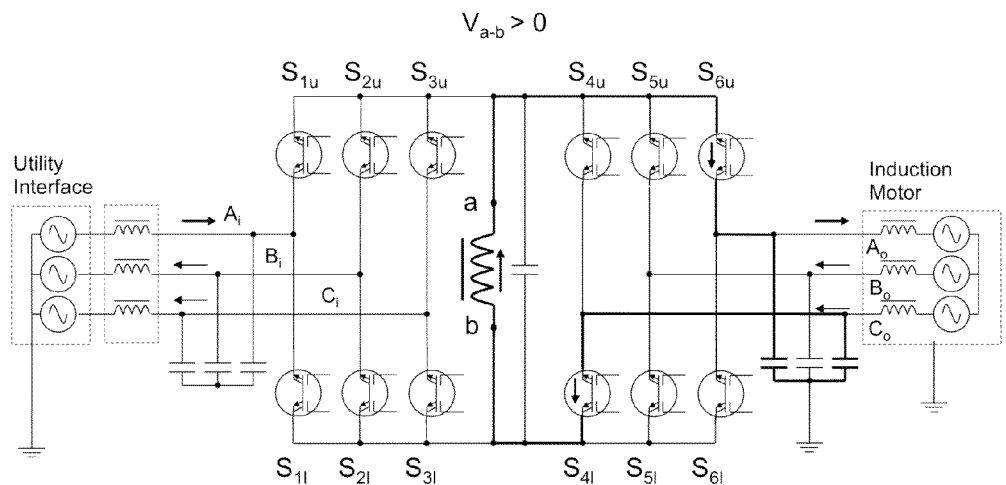

Said first portal can be for example, a 460 VAC three phase utility connection, while said second portal can be a three phase induction motor which is to be operated at variable frequency and voltage so as to achieve variable speed operation of said motor. The present inventions can also accommodate additional portals on the same inductor, as can be desired to accommodate power transfer to and from other power sources and/or sinks, as shown in FIGS. 3W and 3X.

Referring to FIG. 3H, converter 100 is comprised of a first set of electronic switches $S_{1u}$, $S_{2u}$, $S_{3u}$, $S_{4u}$, $S_{5u}$, and $S_{6u}$ that are connected between a first port 113 of a link inductor 120 and each phase, 124 through 129, of the input portal, and a second set of electronic switches $S_{1l}$, $S_{2l}$, $S_{3l}$, $S_{4l}$, $S_{5l}$, and $S_{6l}$ that are similarly connected between a second port 114 of link inductor 120 and each phase of the output portal. A link capacitor 121 is connected in parallel with the link inductor, forming the link reactance. Each of these switches is capable of conducting current and blocking current in both directions, as seen in e.g. FIG. 3G. Many other such bi-directional switch combinations are also possible.

The converter 100 also has input and output capacitor filters 130 and 131, respectively, which smooth the current pulses produced by switching current into and out of inductor 120. Optionally, a line reactor 132 can be added to the input to isolate the voltage ripple on input capacitor filter 131 from the utility and other equipment that can be attached to the utility lines. Similarly, another line reactor, not shown, can be used on the output if required by the application.

Figure 3S:
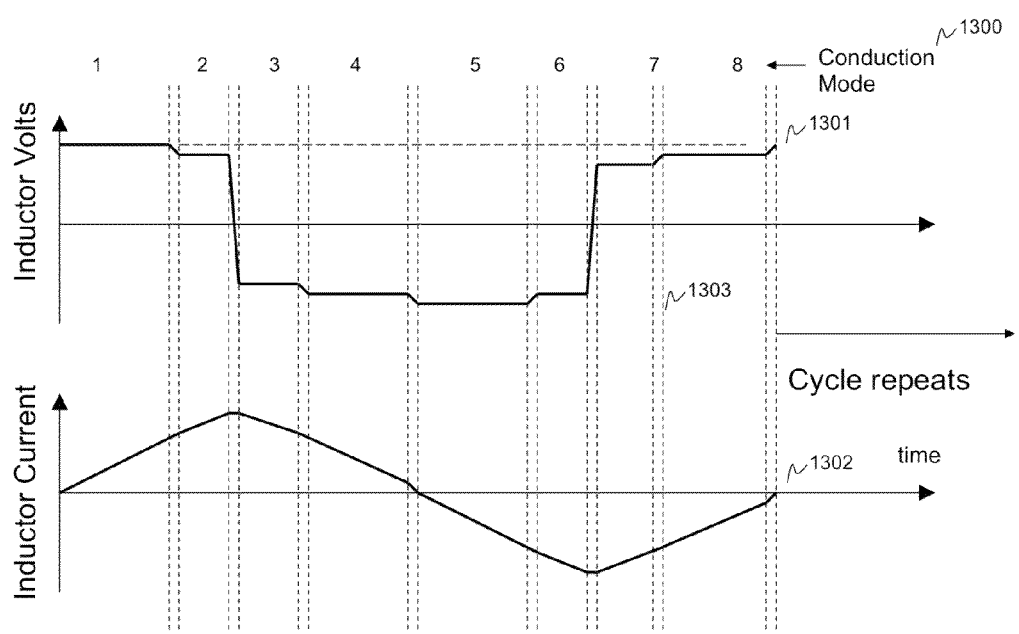
FIG. 3S shows voltage and current waveforms corresponding to the full power condition of FIGS. 3I-3R, with the conduction mode numbers corresponding to the mode numbers of FIGS. 3I-3R.

For illustration purposes, assume that power is to be transferred in a full cycle of the inductor/capacitor from the first to the second portal, as is illustrated in FIG. 3S. Also assume that, at the instant the power cycle begins, phases $A_i$ and $B_i$ have the highest line to line voltage of the first (input) portal, link inductor 120 has no current, and link capacitor 121 is charged to the same voltage as exists between phase $A_i$ and $B_i$. The controller FPGA 1500, shown in FIG. 3T, now turns on switches $S_{1u}$ and $S_{2l}$, whereupon current begins to flow from phases $A_i$ and $B_i$ into link inductor 120, shown as Mode 1 of FIG. 3I.

FIG. 3S shows the inductor current and voltage during the power cycle of FIGS. 3I-3R, with the Conduction Mode sequence 1300 corresponding to the Conduction Modes of FIGS. 3I-3R. The voltage on the link reactance remains almost constant during each mode interval, varying only by the small amount the phase voltage changes during that interval. After an appropriate current level has been reached, as determined by controller 1500 to achieve the desired level of power transfer and current distribution among the input phases, switch $S_{2l}$ is turned off.

Current now circulates, as shown in FIG. 3J, between link inductor 120 and link capacitor 121, which is included in the circuit to slow the rate of voltage change, which in turn greatly reduces the energy dissipated in each switch as it turns off. In very high frequency embodiments of the present inventions, the capacitor 121 can consist solely of the parasitic capacitance of the inductor and/or other circuit elements. (Note that a similar process is shown in FIG. 3O.)

To continue with the cycle, as shown as Mode 2 in FIG. 3K and FIG. 3S, switch $S_{3l}$ is next enabled, along with the previously enabled switch $S_{1u}$. As soon as the link reactance voltage drops to just less than the voltage across phases $A_i$ and $C_i$, which are assumed for this example to be at a lower line-to-line voltage than phases $A_i$ and $B_i$, switches $S_{1u}$ and $S_{3l}$ become forward biased and start to further increase the current flow into the link inductor, and the current into link capacitor temporarily stops.

The two "on" switches, $S_{1u}$ and $S_{3l}$, are turned off when the desired peak link inductor current is reached, said peak link inductor current determining the maximum energy per cycle that can be transferred to the output. The link inductor and link capacitor then again exchange current, as shown if FIG. 3J, with the result that the voltage on the link reactance changes sign, as shown in graph 1301, between modes 2 and 3 of FIG. 3S. Now as shown in FIG. 3L, output switches $S_{5u}$ and $S_{6l}$ are enabled, and start conducting inductor current into the motor phases $A_o$ and $B_o$, which are assumed in this example to have the lowest line-to-line voltages at the present instance on the motor.

After a portion of the inductor's energy has been transferred to the load, as determined by the controller, switch $S_{5u}$ is turned off, and $S_{4u}$ is enabled, causing current to flow again into the link capacitor. This increases the link inductor voltage until it becomes slightly greater than the line-to-line voltage of phases $A_o$ and $C_o$, which are assumed in this example to have the highest line-to-line voltages on the motor. As shown in FIG. 3M, most of the remaining link inductor energy is then transferred to this phase pair (into the motor), bringing the link inductor current down to a low level.

Switches $S_{4u}$ and $S_{6l}$ are then turned off, causing the link inductor current again to be shunted into the link capacitor, raising the link reactance voltage to the slightly higher input line-to-line voltage on phases $A_i$ and $B_i$. Any excess link inductor energy is returned to the input. The link inductor current then reverses, and the above described link reactance current/voltage half-cycle repeats, but with switches that are compeimentary to the first half-cycle, as is shown in FIGS. 3N-3R, and in Conduction Mode sequence 1300, and graphs 1301 and 1302. FIG. 3O shows the link reactance current exchange during the inductor's negative current half-cycle, between conduction modes.

Note that TWO power cycles occur during each link reactance cycle: with reference to FIGS. 3I-3R, power is pumped IN during modes 1 and 2, extracted OUT during modes 3 and 4, IN again during modes 5 and 6 (corresponding to e.g. FIG. 3P), and OUT again during modes 7 (as in e.g. FIG. 3Q) and 8. The use of multi-leg drive produces eight modes rather than four, but even if polyphase input and/or output is not used, the presence of TWO successive in and out cycles during one cycle of the inductor current is notable.

As shown in FIGS. 3I-3S, Conduction Mode sequence 1300, and in graphs 1301 and 1302, the link reactance continues to alternate between being connected to appropriate phase pairs and not connected at all, with current and power transfer occurring while connected, and voltage ramping between phases while disconnected (as occurs between the closely spaced dashed vertical lines of which 1303 in FIG. 3S is one example.

In general, when the controller 1500 deems it necessary, each switch is enabled, as is known in the art, by raising the voltage of the gate 204 on switch 200 above the corresponding terminal 205, as an example. Furthermore, each switch is enabled (in a preferred two gate version of the switch) while the portion of the switch that is being enabled is zero or reverse biased, such that the switch does not start conduction until the changing link reactance voltage causes the switch to become forward biased. Single gate AC switches can be used, as with a one-way switch embedded in a four diode bridge rectifier, but achieving zero-voltage turn on is difficult, and conduction losses are higher.

Figure 3T:
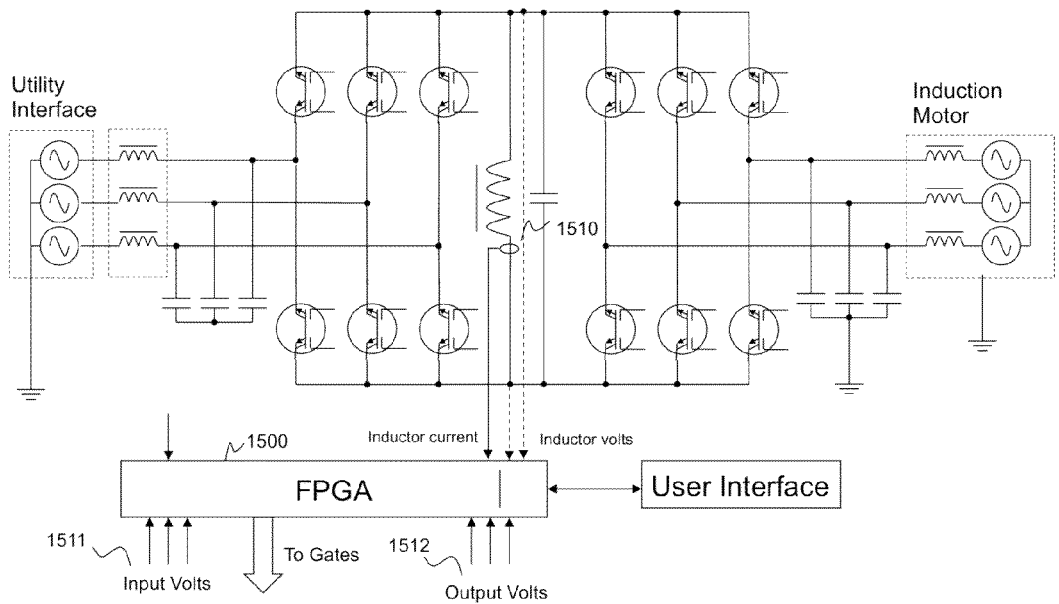
FIG. 3T shows an embodiment of the present inventions with a full bridge three phase cycle topology, with controls and I/O filtering, including a three phase input line reactor as needed to isolate the small but high frequency voltage ripple on the input filter capacitors from the utility.

In FIG. 3T, current through the inductor is sensed by sensor 1510, and the FPGA 1500 integrates current flows to determine the current flowing in each phase (port) of the input and output portals. Phase voltage sensing circuits 1511 and 1512 allow the FPGA 1500 to control which switches to enable next, and when.

FIGS. 3I-3R shows current being drawn and delivered to both pairs of input and output phases, resulting in 4 modes for each direction of link inductor current during a power cycle, for a total of 8 conduction modes since there are two power cycles per link reactance cycle in the preferred embodiment. This distinction is not dependent on the topology, as either three phase converter can be operated in either 2 modes or 4 conduction modes per power cycle, but the preferred method of operation is with 4 conduction modes per power cycle, as that minimizes input and output harmonics.

For single phase AC or DC, it is preferred to have only two conduction modes per power cycle, or four modes per link reactance cycle, as there is only one input and output pair in that case. For mixed situations, as in the embodiment of FIG. 3X which converts between DC or single phase AC and three phase AC, there can be 1 conduction mode for the DC interface, and 2 for the three phase AC, for 3 conduction modes per power cycle, or 6 modes per link reactance cycle. In any case, however, the two conduction modes per power half-cycle for three phase operation together give a similar power transfer effect as the singe conduction mode for single phase AC or DC.

Figure 3U:
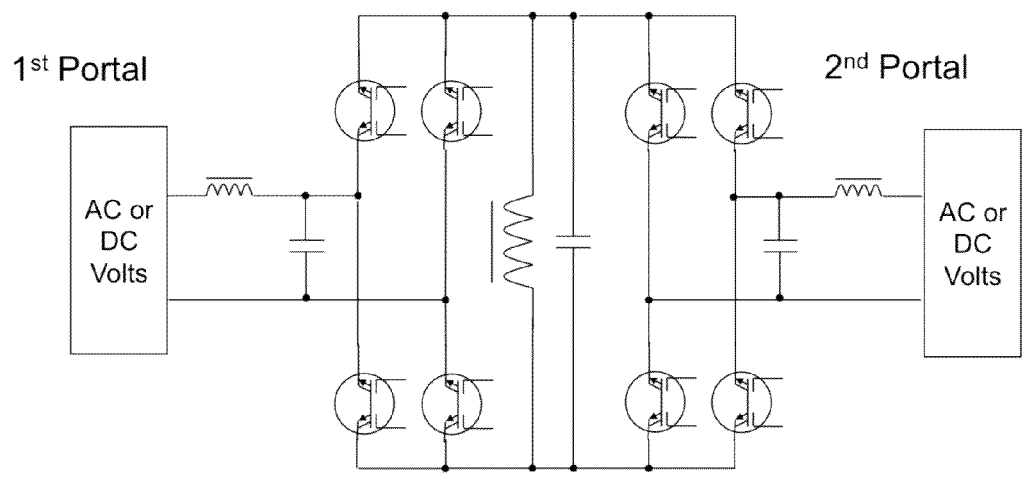
FIG. 3U shows an embodiment of the present inventions with DC or Single Phase portals.

Another sample embodiment of the present inventions is shown in FIG. 3U, which shows a single phase AC or DC to single phase AC or DC converter. Either or both input and output can be AC or DC, with no restrictions on the relative voltages. If a portal is DC and can only have power flow either into or out of said portal, the switches applied to said portal can be uni-directional. An example of this is shown with the photovoltaic array of FIG. 3W, which can only source power.

Figure 3V:
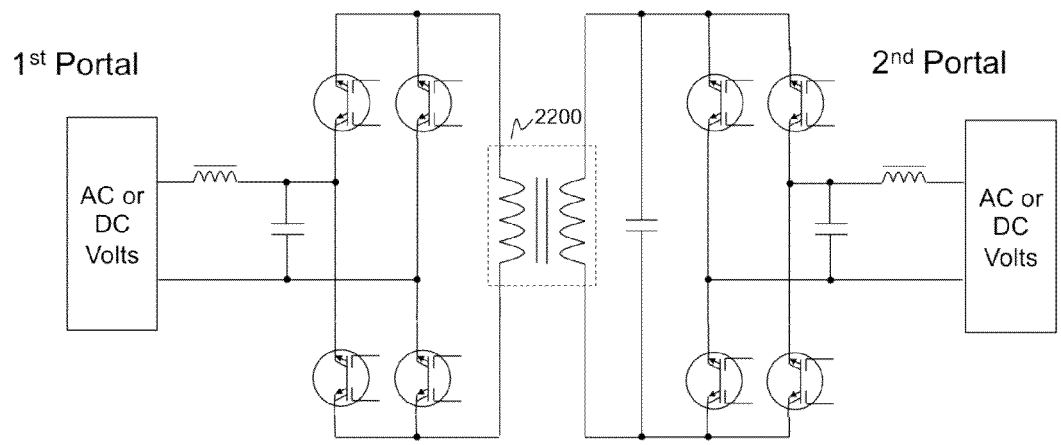
FIG. 3V shows an embodiment of the present inventions with a transformer/inductor.
Figure 3W:
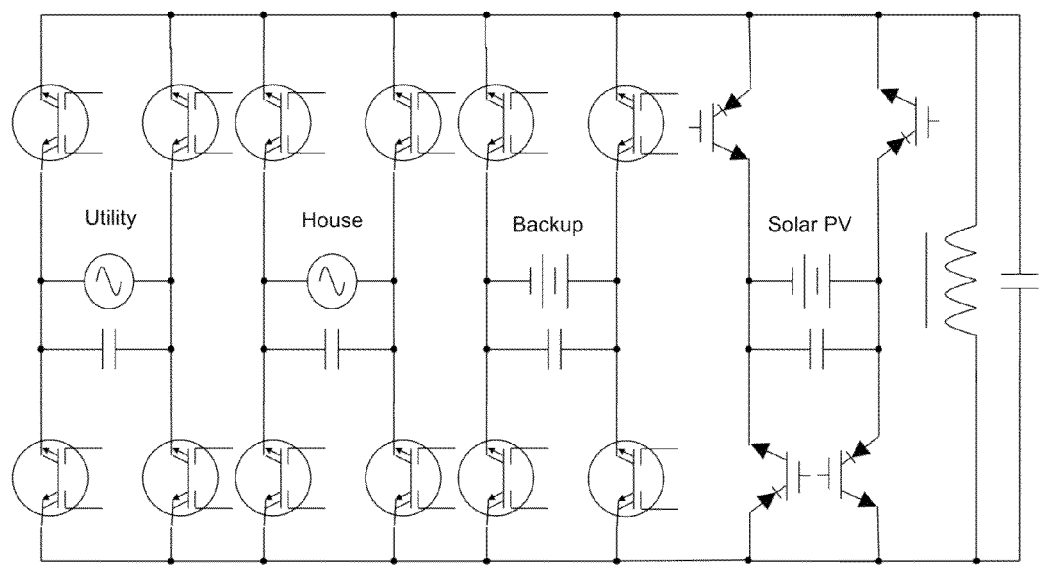
FIG. 3W shows an embodiment of the present inventions in a four portal application mixing single phase AC and multiple DC portals, as may be used to advantage in a solar power application.
Figure 3X:
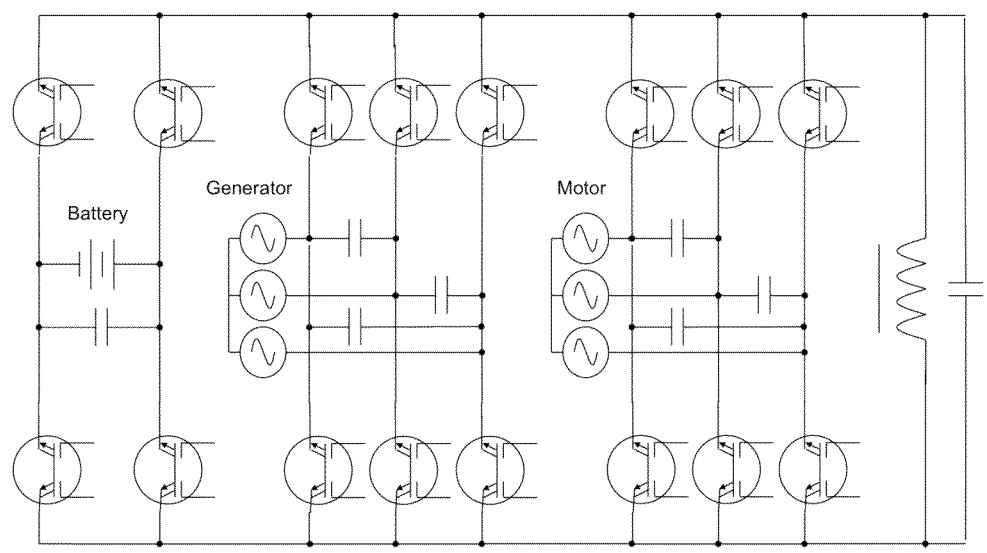
FIG. 3X shows an embodiment of the present inventions in a three portal application mixing three phase AC portals and a DC portal, as may be used to advantage in a Hybrid Electric Vehicle application.

FIG. 3V shows an embodiment of the present inventions as a Flyback Converter. The circuit of FIG. 3U has been modified, in that the link inductor is replaced with a transformer 2200 that has a magnetizing inductance that functions as the link inductor. Any embodiment of the present inventions can use such a transformer, which can be useful to provide full electrical isolation between portals, and/or to provide voltage and current translation between portals, as is advantageous, for example, when a first portal is a low voltage DC battery bank, and a second portal is 120 volts AC, or when the converter is used as an active transformer.

In the embodiments of the present inventions shown in FIGS. 3W and 3X, the number of portals attached to the link reactance is more than two, simply by using more switches to connect in additional portals to the inductor. As applied in the solar power system of FIG. 3W, this allows a single converter to direct power flow as needed between the portals, regardless of their polarity or magnitude.

Thus, in one sample embodiment, the solar photovoltaic array can be at full power, e.g. 400 volts output, and delivering 50% of its power to the battery bank at e.g. 320 volts, and 50% to the house AC at e.g. 230 VAC. Prior art requires at least two converters to handle this situation, such as a DC-DC converter to transfer power from the solar PV array to the batteries, and a separate DC-AC converter (inverter) to transfer power from the battery bank to the house, with consequential higher cost and electrical losses. The switches shown attached to the photovoltaic power source need be only one-way since the source is DC and power can only flow out of the source, not in and out as with the battery.

In the sample power converter of FIG. 3X, as can be used for a hybrid electric vehicle, a first portal is the vehicle's battery bank, a second portal is a variable voltage, variable speed generator run by the vehicle's engine, and a third portal is a motor for driving the wheels of the vehicle. A fourth portal, not shown, can be external single phase 230 VAC to charge the battery. Using this single converter, power can be exchanged in any direction among the various portals. For example, the motor/generator can be at full output power, with 50% of its power going to the battery, and 50% going to the wheel motor. Then the driver can depress the accelerator, at which time all of the generator power can be instantly applied to the wheel motor. Conversely, if the vehicle is braking, the full wheel motor power can be injected into the battery bank, with all of these modes using a single converter.

Figure 3Y:
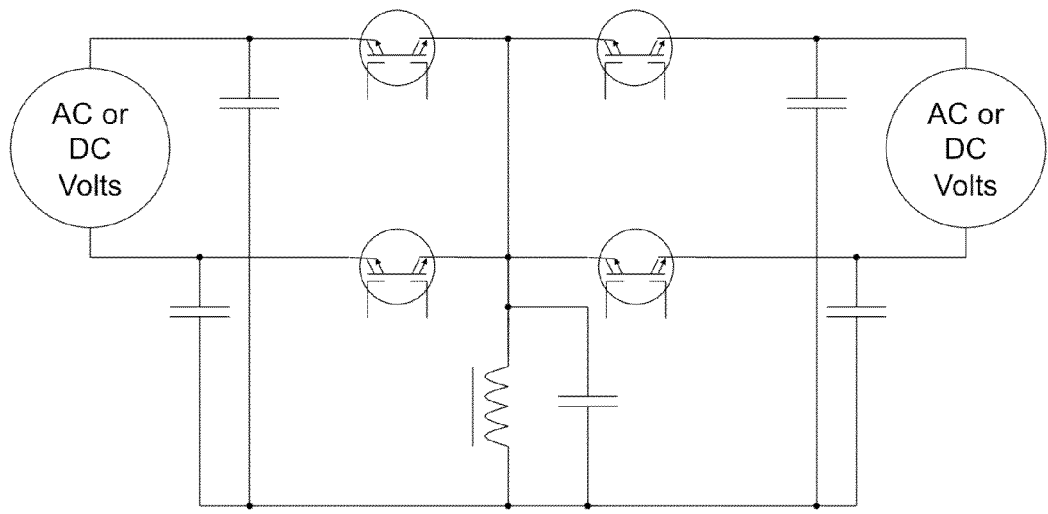
FIG. 3Y shows an embodiment of the present inventions as a Half-Bridge Buck-Boost Converter in a Single Phase AC or DC Topology with BCBS.
Figure 3Z:
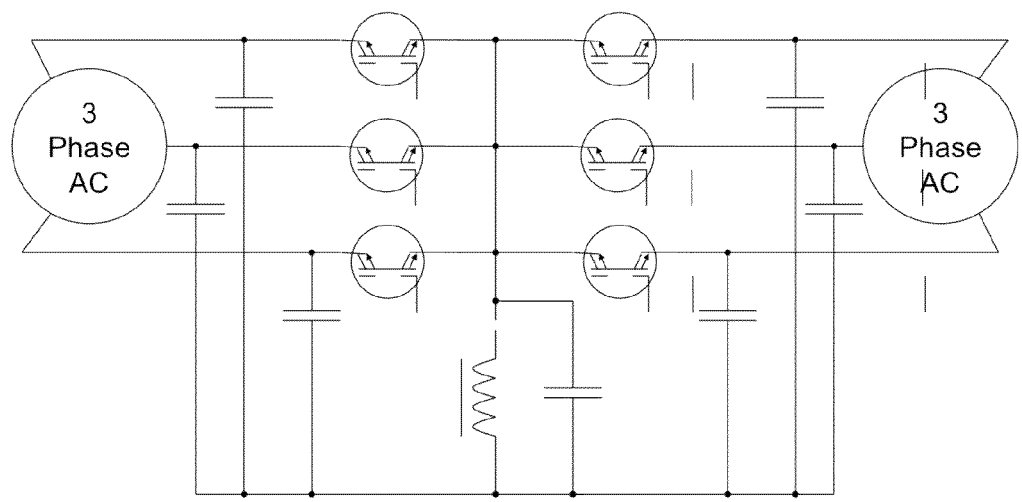
FIG. 3Z show a sample embodiment in a Half-Bridge Buck-Boost Converter in a Three Phase AC Topology with BCBS.
Figure 3A:
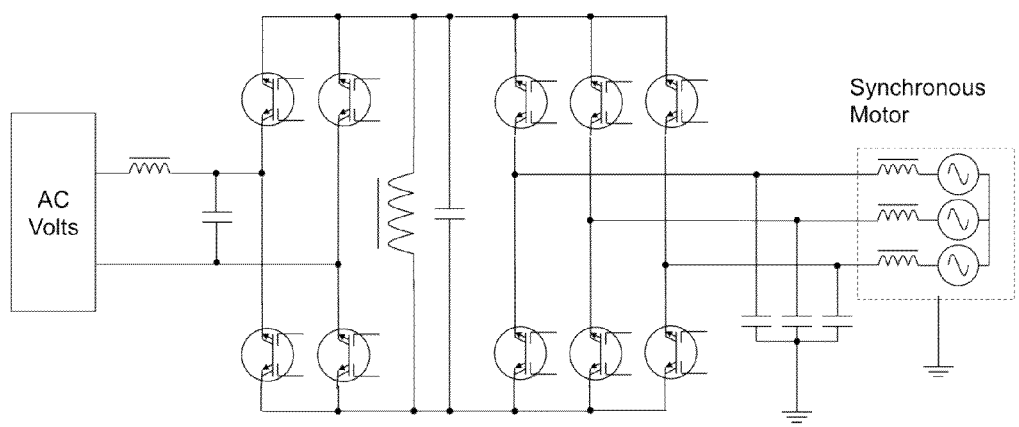
Figure 3B:
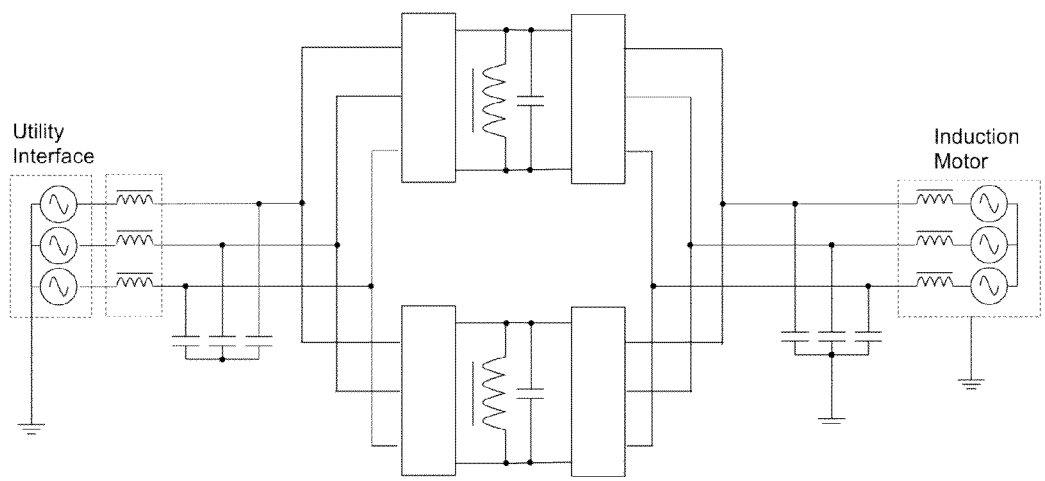
Figure 3C:
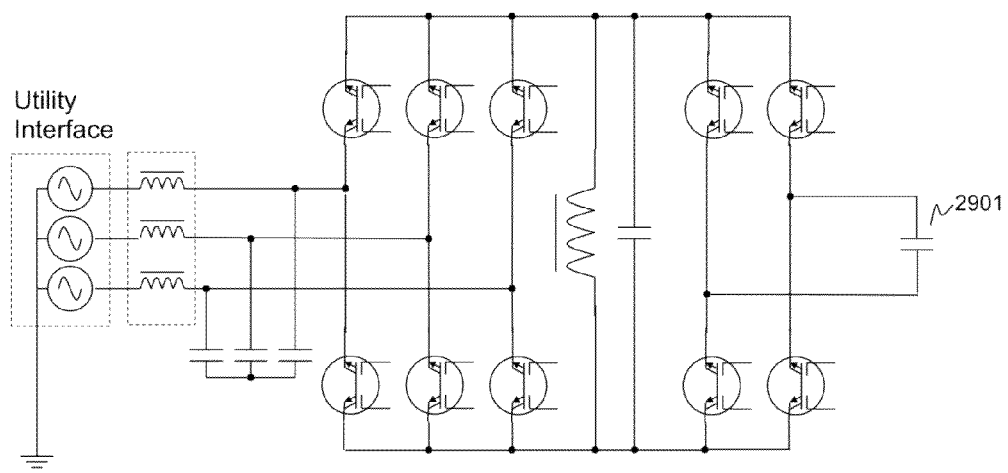
Figure 3D:
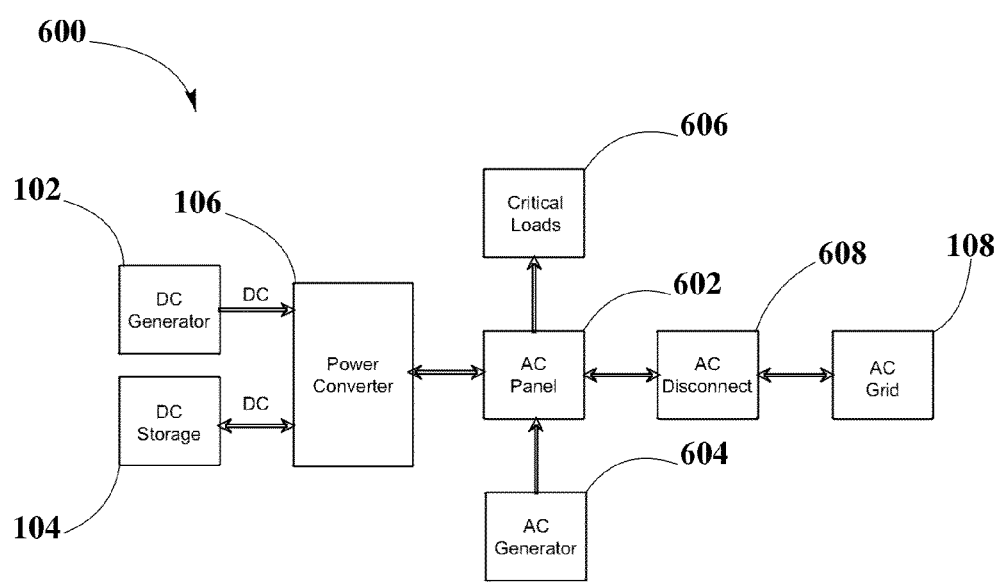
Figure 3E:
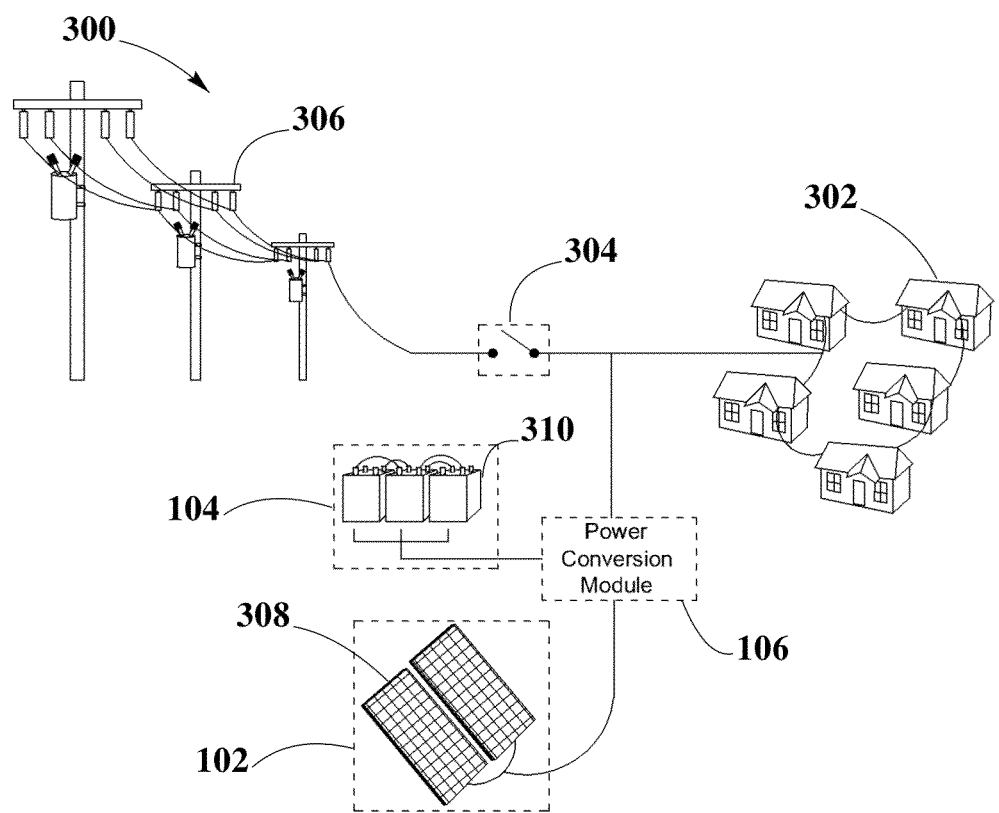

FIGS. 3Y and 3Z show half-bridge converter embodiments of the present inventions for single phase/DC and three phase AC applications, respectively. The half-bridge embodiment requires only 50% as many switches, but results in 50% of the power transfer capability, and gives a ripple current in the input and output filters which is about double that of the full bridge implementation for a given power level.

FIG. 3AA shows a sample embodiment as a single phase to three phase synchronous motor drive, as can be used for driving a household air-conditioner compressor at variable speed, with unity power factor and low harmonics input. Delivered power is pulsating at twice the input power frequency.

FIG. 3BB shows a sample embodiment with dual, parallel power modules, with each module constructed as per the converter of FIG. 3H, excluding the I/O filtering. This arrangement can be advantageously used whenever the converter drive requirements exceed that obtainable from a singe power module and/or when redundancy is desired for reliability reasons and/or to reduce I/O filter size, so as to reduce costs, losses, and to increase available bandwidth.

The power modules are best operated in a manner similar to multi-phase DC power supplies such that the link reactance frequencies are identical and the current pulses drawn and supplied to the input/output filters from each module are uniformly spaced in time. This provides for a more uniform current draw and supply, which can greatly reduce the per unit filtering requirement for the converter. For example, going from one to two power modules, operated with a phase difference of 90 degrees referenced to each of the modules inductor/capacitor, produces a similar RMS current in the I/O filter capacitors, while doubling the ripple frequency on those capacitors. This allows the same I/O filter capacitors to be used, but for twice the total power, so the per unit I/O filter capacitance is reduced by a factor of 2. More importantly, since the ripple voltage is reduced by a factor of 2, and the frequency doubled, the input line reactance requirement is reduced by 4, allowing the total line reactor mass to drop by 2, thereby reducing per unit line reactance requirement by a factor of 4.

FIG. 3CC shows a sample embodiment as a three phase Power Line Conditioner, in which role it can act as an Active Filter and/or supply or absorb reactive power to control the power factor on the utility lines. If a battery, with series inductor to smooth current flow, is placed in parallel with the output capacitor 2901, the converter can then operate as an Uninterruptible Power Supply (UPS).

FIG. 3A shows an example of a circuit implementing this architecture. In this example, one port is used for connection to the AC grid (or other three-phase power connection). The other is connected to a motor, to provide a variable-frequency drive.

In FIG. 3A, an LC link reactance is connected to two DC portals having two ports (e.g. lines) each, and to a three-phase AC portal. Each port connects to a pair of bidirectional switches, such that one bidirectional switch connects the respective port to a rail at one side of the link reactance and the other bidirectional switch connects the port to a rail at the other side of the link reactance.

In one sample embodiment, voltage and current across a link reactance can be seen in, e.g., FIG. 3B. Link voltage waveform 1301 and link current waveform 1302 correspond to an arbitrary set of inputs and outputs. After a conduction interval begins and the relevant switches are activated, voltage 1301 on the link reactance remains almost constant during each mode interval, e.g. during each of modes 1-8. After an appropriate current level has been reached for the present conduction mode, as determined by the controller, the appropriate switches are turned off. This can correspond to, e.g., conduction gap 1303. The appropriate current level can be, e.g., one that can achieve the desired level of power transfer and current distribution among the input phases.

Current can now circulate between the link inductor and the link capacitor, which is included in the circuit to slow the rate of voltage change. This in turn greatly reduces the energy dissipated in each switch as it turns off After the link voltage reaches appropriate levels for the next set of ports, the appropriate switches are enabled, and energy transfer between the portal and the link continues with the next line pair.

A power converter according to some embodiments of this architecture can be controlled by, e.g., a Modbus serial interface, which can read and write to a set of registers in a field programmable gate array (FPGA). These registers can define, e.g., whether a portal is presently an input, an output, or disabled. Power levels and operation modes can also be determined by these registers.

In some embodiments, a DC portal preferably has one line pair, where each line pair is e.g. a pair of ports that can transfer energy to or from the link reactance through semiconductor switches. A three-phase AC portal will always have three lines, and will often have a fourth (neutral), but only two will be used for any given power cycle.

Given three lines, there are three possible two-line combinations. For example, given lines A, B, and C, the line pairs will be A-B, B-C, and A-C. At least one of these line pairs will be configured as an input and at least one line pair will be configured as an output.

Register values for each portal can be used to determine the amount of charge, and then the amount of energy, to be transferred to or from each portal during each conduction period. An interface then controls each portal's switches appropriately to transfer the required charge between the link and the enabled portals.

A separate set of working registers can be used in some embodiments to control converter operations. Any value requiring a ramped rate of change can apply the rate of change to the working registers.

The mode set for a portal during a given power cycle can determine what factor will drive the portal's power level. This can be, for example, power, current, conductance, or net power. In "net power" mode, the portal's power level can be set by, e.g., the sum of other portal's power settings. The mode of at least one portal will most preferably be set to net power in order to source or sink the power set by the other portals. If two portals are set as net power, the two portals will share the available power.

A main control state machine and its associated processes can control the transfer of power and charge between portals, as seen in FIG. 3C. The state machine can be controlled in turn by the contents of registers. The state machine transfers the amount of energy set by the interface from designated input portals to the link reactance, and then transfers the appropriate amount of energy from the link to designated output portals.

The Reset/Initialize state occurs upon a power reset, when converter firmware will perform self-tests to verify that the converter is functioning correctly and then prepare to start the converter. If no faults are found, the state machine proceeds to the Wait_Restart state.

The Wait_Restart state can be used to delay the start of the converter upon power up or the restart of the converter when certain faults occur. If a fault occurs, a bleed resistor is preferably engaged. Certain faults, once cleared, will preferably have a delay before restarting normal converter operation. The next state will be Startup.

When the Startup state begins, there is no energy in the link. This state will put enough energy into the link to resonate the link to the operational voltage levels, which are preferably greater than the highest voltage of any input line pair.

When starting from an AC portal, the firmware will wait until a zero voltage crossing occurs on a line pair of the AC portal. The firmware will then wait until the voltage increases to about 40 volts, then turn on the switches of the line pair for a short duration. This will put energy into the link and start the link resonating. The peak resonant voltage must be greater than the AC line pair for the next cycle. After the first energy transfer, more small energy transfers can be made to the link as the link voltage passes through the line pair voltage, increasing the link's resonant voltage until the link's peak voltage is equal to or greater than the first input line pair voltage. At this point, a normal power cycle is ready to start and the state will change to Power Cycle Start upon detection of a zero current crossing in the link.

In the Power Cycle Start state, the amount of charge and energy that will be transferred to or from the link and each portal is determined at the start of a power cycle. This state begins on a link zero current crossing detection, so the link current will be zero at the start of the state. The link voltage will preferably be equal or greater than the highest input voltage.

The input and output line pairs that are not disabled will be sorted by their differential voltages from the highest voltage to the lowest voltage, where outputs are defined as having a negative voltage with respect to the start of the current power cycle. If the power factor of the AC portal is not unity, one of the two line pairs of the AC portal will switch between input and output for a portion of a 60 Hz waveform.

If a DC portal's mode is set to have constant current or constant power, the constant current or power levels are converted to equivalent conductance values and used to adjust the relevant portal's settings appropriately. If the portal's mode is set to net power, the portal will transfer the sum of all the energy of all other portals not in net power mode.

MPPT (Maximum Power Point Tracking) mode preferably constantly adjusts the charge put into the Link from a photovoltaic array to maximize transferred energy. There will typically be a maximum current draw after which voltage begins to decrease, where the particular maximal current depends on the photovoltaic array's output characteristics. This maximal current corresponds to maximum power, beyond which point energy transfer will decline. To determine this maximal point, energy transfer can be monitored while conductance is adjusted until a local maximum is found. There can be some variations in the amount of energy delivered, but this will tend to maximize energy transfer.

The charge Q to be transferred to the link can be found as, e.g., the product of conductance G, voltage V, and link power cycle period T (i.e. $Q=G*V*T$). The energy E to be transferred is then simply the product of the voltage times the charge ($E=V*Q=G*V^2*T$).

Since other portal operation modes prescribe the energy to be transferred to or from the link, at least one portal is most preferably in net power mode. At least one portal is most preferably thus dependent on the energy in the link, rather than prescribing the same, so that the amount of energy put into the link equals the amount of energy taken out of the link.

The amount of energy that is put into the link by other modes is summed together to determine the energy transfer to or from portals operating in net power mode. A small amount of energy can in some cases be subtracted from this sum if extra energy is to be added to the link this cycle. If multiple portals are operating in net power mode, the available energy is preferably split between the two ports according to, e.g., the Modbus registers. The amount of charge to be transferred is preferably determined by the relationship charge=energy/voltage.

For an AC portal, the phase angle between the voltage and current on the AC portal can be varied, based on e.g. power factor settings. An AC portal can also source reactive current for AC portal filter capacitors to prevent the filter capacitors from causing a phase shift.

Three-phase charge calculations for a three-phase AC portal can, in some embodiments, proceed as follows. Zero crossing of the AC voltage waveform for a first phase is detected when the voltage changes from a negative to positive. This can be defined as zero degrees, and a phase angle timer is reset by this zero crossing. The phase angle timer is preferably scaled by the measured period of the AC voltage to derive the instantaneous phase angle between the voltage of this first phase and the zero crossing. The instantaneous phase angle can then be used to read the appropriate sinusoidal scalar from a sinusoidal table for the first phase. The instantaneous phase angle can then be adjusted appropriately to determine the sinusoidal scalars for the second and third phases.

The instantaneous phase angle of the first phase can be decremented by e.g. 90° to read a reactive sinusoidal scalar for the first phase, and then adjusted again to determine reactive sinusoidal scalars for the other two phases.

The required RMS line current of the portal can then be determined, but can differ dependent on, e.g., whether the portal is in net power mode is controlled by conductance. In conductance mode, RMS line current can be found by, e.g., multiplying the conductance for the AC portal by its RMS voltage.

In net power mode, RMS line current can be found e.g. as follows. The energy transferred to the link by all portals not in net power mode is first summed to determine the net power energy available. The small amount of energy defined by the link energy management algorithm can be subtracted from the available energy if relevant. The net energy available is multiplied by the percentage of total power to be allocated to the present portal, which is 100% if only one portal is in net power mode: Power=Σ Energy*portal %.

Line RMS current can then be found by dividing the energy for the AC port by the RMS voltage of the portal, the link power cycle period, and square root of 3: line current$_{rms}$=Power/(time$_{link\ cycle}$*voltage$_{rms}$*√3).

The instantaneous in-phase current can then be calculated, and will again differ based on the operational mode of the portal. In a conductance mode, the three line-to-line instantaneous voltages can be multiplied by the portal conductance to determine the instantaneous current of each phase.

In net power mode, the sinusoidal scalar for each phase can be multiplied by the RMS line current to determine the instantaneous current of each phase. Alternately, voltages from an analog/digital converter can be used to find the instantaneous currents directly: Instantaneous Current=energy*$V_{a/d}$/(3*period*Vrms$^2$). The charge can then be found as Q=energy*$V_{a/d}$/(3*Vr$_{ms}^2$).

RMS line reactive current can then be found e.g. from power factor as follows: Power Factor=Power/(Power+reactive power)

reactive power=(Power/power factor)−Power reactive power$_{line\ to\ line}$=Power/(3*power factor)−Power/3 rms reactive current$_{line}$=reactive power$_{line\ to\ line}$/rms voltage$_{line\ to\ line}$.

Filter capacitive current can then be calculated from the filter capacitance values, line to line voltage, and frequency. Capacitive compensation current can then be added to the RMS line reactive current to determine the total RMS line reactive current. Total RMS reactive current can then be multiplied by the reactive sinusoidal scalar to derive the instantaneous reactive current for each phase.

The instantaneous current and the instantaneous current for each phase can then be added together and multiplied by the period of the link power cycle to determine the amount of charge to be transferred for each phase.

The energy to transfer to or from the link can be found by multiplying the charge value of each phase by the instantaneous voltage and summing the energy of the three phases together.

The phase with the largest charge will be dominant phase for this cycle, and the two line pairs for the AC port will be between the dominant phase and each of the other two phases. The amount of charge to be transferred for each line pair will be the amount of charge calculated for the non-dominant line of the pair. The next state will be the Charge Transfer state.

In the Charge Transfer state, a first line pair is selected and the respective switches turned on. Even though the switches are on, no conduction will occur until the voltage of the link drops below that of an input line pair, or rises above the voltage of an output line pair where appropriate. If one end of the link inductor reaches the voltage of one line of the line pair, that end of the link inductor is indirectly anchored to the respective line. The link inductor will subsequently not change in voltage until the respective switch is turned off.

The voltage of the line pair is then compared to the integrated link voltage. It is generally assumed that current will begin to flow through the switches once the integrated link voltage reaches the voltage of the line pair, minus a switch voltage drop. This switch voltage drop is assumed to be on the order of e.g. 8 V for a pair of switches.

The amount of charge flowing into or out of the link is monitored. The charge can be found as Q=ΣIΔt, or the sum of the current times the time interval.

The link current is typically approximately zero at the start of a power cycle. The link current increases through the end of the last input, then decreases until reaching zero at the beginning of the next power cycle. The link current can be found as I=Σ(V$_{instantaneous}$ Δt/L), or the sum of the instantaneous voltage times the time interval divided by the inductance.

When the transferred charge is determined to have met the calculated amount for the given line pair, the state machine can progress to the next state. The next state can be Common Mode Management, or can be Idle. If the next state is Idle, all switches are turned off. In some sample embodiments, the state machine will only progress to the Common Mode Management state after the final output line pair.

The Common Mode Management state controls the common mode voltage of the link, as well as the energy left in the link following the prior state. To control the common mode voltage, one of the switches for the prior line pair is turned off, while the other switch is controlled by the Common Mode Management state. By having one switch on, the adjacent end of the link can be anchored at the respective line voltage. The voltage at the opposite end of the link can then increase until the current through the inductor drops to zero. The remaining switch can then be turned off. When a zero crossing is detected in the link current, the state machine will progress to the Idle state.

Two types of anchoring can be used in Common Mode Management. Direct anchoring occurs when one switch of a line pair is closed (turned on), which fixes the voltage of the nearest end of the link to the respective line voltage. While this switch is turned on, any change to the link's differential voltage will occur on the other end of the link, which will in turn change the link's common mode voltage.

Indirect anchoring occurs when both of a line pair's switches are turned on prior to a charge transfer. When the voltage of one end of the link is one switch-voltage-drop below the corresponding line voltage, the respective end of the link is anchored to that voltage. The voltage of the other end of the link will continue to change until the voltage across the link is equal to two switch-voltage-drops below the line pair voltage. At this point, charge transfer between the link and the line pair begins.

The Common Mode Management state also controls the energy left in the link after output charge transfer is completed, or after ramp-up. After the last output charge transfer, enough energy will most preferably remain in the link to have completed the last output charge transfer, and to cause the link voltages first to span, and then to decrease to just below, the voltages of the first input line pair. This can permit zero-voltage switching of the input switches. Zero-voltage switching, in turn, can reduce switching losses and switch overstressing. The voltages across the switches when conduction begins can preferably be e.g. 4 V, but is most preferably no more than 20 V. If insufficient energy remains in the link to permit zero-voltage switching, a small amount of power can be transferred from one or more ports in net power mode to the link during the subsequent power cycle.

FIG. 3D shows a sample embodiment in which the voltages of the last output span the voltages of the first input. It can be seen that the link-energy requirements have been met, though small amounts of energy can occasionally be needed to account for link losses.

FIG. 3E shows another sample embodiment in which the voltages of the last output are spanned by the voltages of the first input. Enough energy must be maintained in the link to resonate the link voltages to above the voltages of the first input. Additional energy can sometimes be needed to account for small link losses, but the link-energy requirements can be met fairly easily.

FIG. 3F shows a third sample embodiment, in which the voltages of the last output neither span nor are spanned by the voltages of the first input. Since the last output voltages do not span the first input voltages, the link voltage will need to be increased. Enough energy in the link needs to be maintained in the link to resonate the link voltages above the voltages of the first input pair before the link current crosses zero. This can in some sample embodiments require small amounts of additional energy to fulfill this requirement.

In each of the sample embodiments of FIGS. 3D-3F, the common mode voltage of the link will preferably be forced toward the common mode voltage of the first input. The switch of the last output furthest in voltage from the common mode voltage will preferably be turned off first. The link will thus first anchor to the end with a voltage closest to that desired while the other end changes. The other switch is preferably turned off either once the common mode voltage of the first input is turned off or else a zero-crossing is detected in the link current.

The Idle State most preferably ensures that all link switches remain for a period of time immediately after a switch is turned off. As switches do not turn off instantaneously, this can be used to minimize cross-conduction between lines, which can occur when one switch is turned on before another has time to completely turn off. In some sample embodiments in which the switches comprise e.g. IGBTs, the time between nominal and actual turn-off of the switches can be significant. After the requisite time has elapsed, the state machine can advance to the next state. If the prior state was the last line pair, the next state is preferably the Power Cycle Start state, and is otherwise preferably the Charge Transfer state.

In one sample embodiment, the bidirectional switches can comprise, e.g., two series IGBTs and two parallel diodes, as in FIG. 3G. In an embodiment like that of FIG. 3G, a bidirectional switch can have two control signals, each controlling one direction of current flow. Other bidirectional switches are also possible.

Switch control signals are most preferably monitored to prevent combinations of switches being turned which can lead to catastrophic failures of the converter. Only switches corresponding to a single line pair will preferably be enabled at a time. As relatively few possible switch combinations will prevent catastrophic failure, monitoring can look for the few permissible combinations to allow instead of looking for the many combinations to forbid.

Switch control signals can preferably also be monitored to avoid turning new switches on too quickly after another switch has been turned off. The switches take a finite time to turn off, and turning on another switch too quickly can cause damaging cross-conduction.

Voltage across each switch is also preferably monitored before it is turned on to avoid damaging overvoltage.

Zero-crossings in the link current are preferably detected e.g. using a toroid installed on a link cable. Instead of directly measuring link current, it can be calculated by integrating the voltage across the link and scaling the result. This calculated current can preferably be reset every time a zero-crossing is detected, to prevent long-term accumulation of error. Zero-crossings, when detected, can also be used to set the link polarity flag, as the voltage across the link reverses when the direction of current flow changes.

In some sample embodiments, power converter voltages can be measured with high-speed serial analog-to-digital (A/D) converters. In one sample embodiment, these converters can have e.g. a 3 MSPS (mega-samples per second) conversion rate. In one sample embodiment, the converters can take e.g. 14 clocks to start a conversion and clock in the serial data, leading to e.g. a data latency of 0.3 µs. One sample embodiment can use e.g. 22 such A/D converters.

Islanding occurs when a converter continues to output power when the AC power grid goes down. This can be extremely dangerous, especially for line crews attempting to fix the AC power grid. Islanding conditions are most preferably detected and used to trigger a shutdown of the converter's AC output.

Ground faults will most preferably be detected on DC inputs. When DC contactors are closed, the voltage drop between the common connection of a portal's connectors and the DC portal's ground connection will preferably be measured. If this voltage is over a certain limit, either too much ground current is present or else the portal's ground fuse is blown. Both of these situations will generate a fault.

A fault will preferably be generated if toroids on input cables detect surges.

Each DC portal will preferably have a pair of contactors connecting positive and negative power sources to an input ground connection. Configuration information is preferably read from the registers and used to open or close the contactors as needed. Before contactors are closed, DC filter capacitors are preferably pre-charged to the voltage on the line side of the contactors in order to prevent high-current surges across the contacts of the contactors.

An LCD or other type of screen is preferably provided as an interface to a power converter.

The temperature of a heat sink is preferably monitored and used to direct fans. Tachometers on the fans can preferably be monitored, and the information used to shut down fan control lines if a fan fails. As these temperature sensors can occasionally give incorrect information, in some sample embodiments e.g. two preceding readings can be compared against the current temperature reading, and e.g. the median value can be chosen as the current valid temperature.

In some sample embodiments, a processor can be used to control a power converter. This can be e.g. a NIOS processor which is instantiated in the field-programmable gate array.

In some sample embodiments, an interface to e.g. a 1 GB flash RAM can be used. In one sample embodiment, a flash RAM can have e.g. a 16-bit-wide bus and e.g. a 25-bit address bus. In some sample embodiments, an active serial memory interface can permit reading from, writing to, or erasing data from a serial configuration flash memory.

In some sample embodiments, a field-programmable gate array can be connected to e.g. a 1 MB serial nvSRAM with real time clock.

In some sample embodiments, dual row headers on a pc board can be used e.g. for testing and debugging purposes.

In some sample embodiments, LEDs or other indicators can be present on a control board. These indicators can be used e.g. for diagnostic purposes.

To minimize risks of condensation or other types of moisture damaging electronics, a power converter can preferably be kept in a sealed compartment. Some air flow is often necessary, however, due to e.g. temperature changes over time. Any air flowing into or out of the converter most preferably passes through one or more dehumidifiers. If left alone, the dehumidifiers eventually saturate and become useless or worse. Instead, heating elements can preferably be included with dehumidifiers to drive out accumulated moisture. When air flows into the otherwise-sealed compartment, dehumidifiers can remove moisture. When air flows out of the compartment, the heating elements can activate, so that ejected moisture is carried away with the outflowing air instead of continuing into the converter.

As used herein, "point of isolation" can refer to an exact point between an inverter and a power distribution grid, where the inverter can be totally disconnected from the grid.

Figure 1:
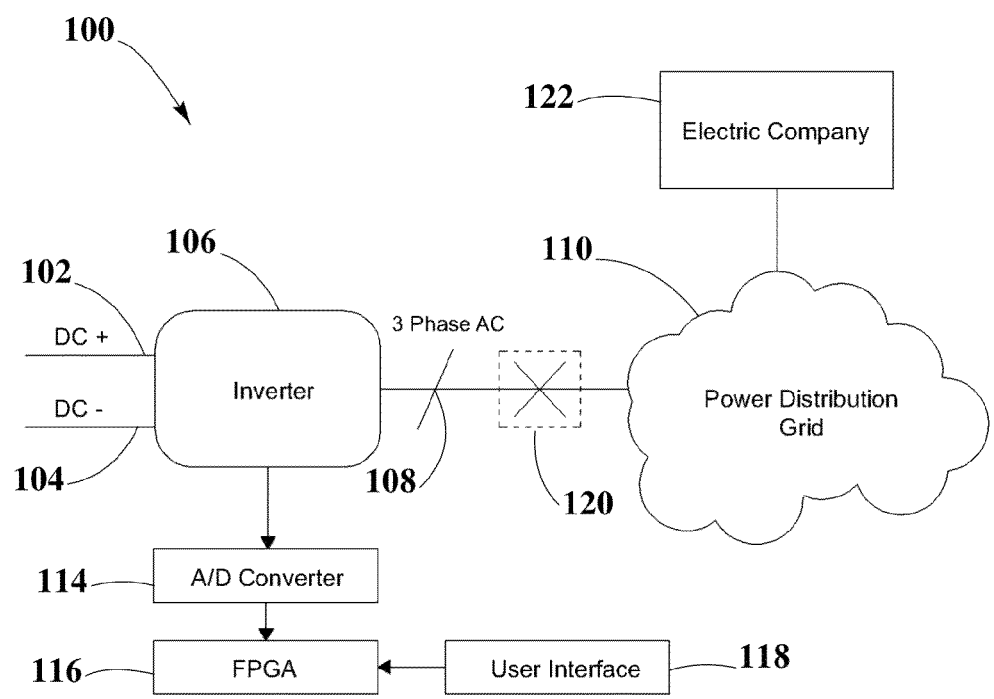
FIG. 1 illustrates an exemplary inverter with a three-phase AC output connected to a power distribution grid, according to an embodiment.

FIG. 1 illustrates an inverter with a three-phase AC 100. The circuit can include DC+ 102 and DC− 104 rails to inverter 106. Inverter 106 can be connected to a photovoltaic array, wind turbine or other kind of power source. Inverter 106 can be further connected to three-phase AC 108.

Inverter 106 can also include voltage or current sensors or both (not shown), to sense voltages and current in the different phases of inverter 106. Sensors can provide information about input and output voltage or current, or both. Thereafter, this data can be sent to an A/D converter 114, converting analog information into digital information for an field-programmable gate array (FPGA) controller 116 to analyze. Then, through calculations, waveform look-up tables and control algorithms embedded in the FPGA controller 116, the FPGA controller 116, can select suitable switches (not shown), to open and close connections from three-phase AC 108 to the DC+ 102 and DC− 104 rails. Additionally, a user interface 118 can be connected to the FPGA controller 116, to allow a user to monitor voltage or current waveforms, or both, and to input data necessary for control of the inverter 106.

Three-phase AC 108 can be connected to the power distribution grid 110 through a point of isolation 120, where three-phase AC 108 can be islanded from power distribution grid 110. Power distribution grid 110 can be further connected to electric company 122, which can distribute power to a particular region.

Figure 2:
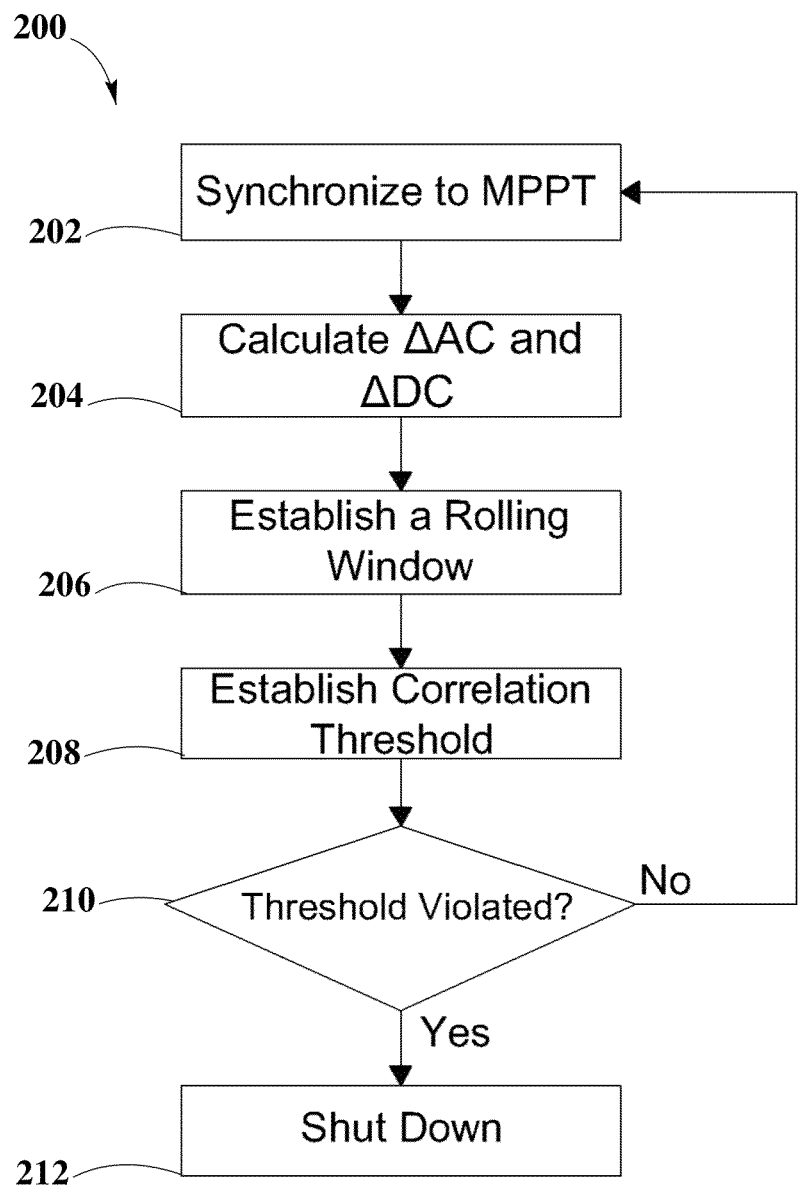
FIG. 2 depicts a flowchart of one sample method of islanding isolation, according to an embodiment.

FIG. 2 depicts a flowchart of an embodiment of a method 200 of detecting islanding isolation. Some conditions for the processes described herein may apply, such that first, a maximum power point tracking (MPPT) algorithm makes continual changes in DC power draw, and second, measurement of AC/DC voltages from sensor data is made, which allows inference of AC and DC current and power.

A suitable MPPT method is disclosed in the commonly-owned and co-pending application cited above.

One sample embodiment of the present processes begins by synchronization 202 of calculations to the MPPT algorithm. Each time the MPPT algorithm changes the DC power draw, the synchronization step 202 can be repeated. Following this process, a calculation of changes in DC power and AC voltages are performed in block 204. Calculation 204 can include determining a correlation product (so-called because as power moves down/up, correspondingly voltage goes down/up), which is equal to ΔDC power times ΔAC voltage, where Δ is a change in the variable. Thus, if power increases slightly in power distribution grid 110, the AC voltage can also increase in three-phase AC 108 during islanding detection. In addition, if power decreases in power distribution grid 110, the AC voltage will also decrease in three-phase AC 108.

In block 206 a rolling window filter is established for the last predetermined number of correlation products. To allow for a suitable signal-to-noise ratio, this rolling window filter can maintain e.g. the last 48 correlation products. Therefore, if the result of the sum of the last predetermined number of correlations is over such a predetermined threshold, it is assumed that islanding has been detected.

At block 210, violation checking of the correlation threshold 208 is performed. Thus, if a positive violation of the correlation threshold 208 has occurred, the inverter 106 is immediately shut down at step 212 to prevent any damage, otherwise, the process can cycle and return to block 202. The shut down 212 can typically be performed in about one to two seconds.

In a second example, an MPPT algorithm is not used, as in e.g. DC to AC conversion. Modifications in the algorithm as shown in FIG. 2 can be needed to introduce changes in the power exported; that is, the power output of the converter is caused to fluctuate. Observation of these fluctuations can be used as described above in connection with an MPPT algorithm, and the same methods for islanding detection can be used.

According to some but not necessarily all embodiments, there is provided: Methods and systems for islanding detection in power generators, particularly converters. The present innovative methods can disconnect the power converter from the power distribution grid. Islanding detection can be performed by detecting the difference in resistive impedance between the islanded and un-islanded conditions, using an input-output power and input-output voltage correlation technique. The present methods can shut down the power converter instead of allowing it to continue running without connection to the grid, which will protect line-worker safety.

According to some but not necessarily all embodiments, there is provided: A method for islanding detection in a power converter comprising: making continual changes in DC power draw of a power converter which comprises a DC input and an AC output; sensing the AC output voltage of the converter responding to each change in the DC power draw; calculating a correlation product by multiplying the change in DC power draw by the corresponding change in the AC output voltage; summing a predetermined number of correlation products over a rolling window to produce a correlation sum; and, for each rolling window, detecting if the predetermined correlation sum has exceeded a predetermined threshold; and shutting down the power converter if the predetermined correlation sum has exceeded the predetermined threshold.

According to some but not necessarily all embodiments, there is provided: A power converter comprising: a DC to AC inverter; a stored-program controller; wherein the stored-program controller executes instructions to control switches in the inverter; wherein the switches further control the DC current draw of the inverter and the AC output voltage of the inverter; wherein the stored-program controller further executes instructions to: make continual changes in the DC power draw of the inverter; sense the AC output voltage of the inverter responding to each change in the DC power draw of the inverter; calculate a correlation product by multiplying the change in DC power draw by the corresponding change in the AC output voltage; sum a predetermined number of correlation products over a rolling window to produce a correlation sum; and, for each rolling window, detecting if the predetermined correlation sum has exceeded a threshold; and, if the predetermined correlation sum has exceeded the predetermined threshold, then shutting down the power converter.

According to some but not necessarily all embodiments, there is provided: A power converter comprising: a controller; a first array of bidirectional switches, connecting lines of a first port to a first terminal of a paralleledd inductor plus capacitor combination, in either of two opposite directions, regardless of the polarity of the external lines at the first port; a second array of bidirectional switches, connecting lines of a second port to a second terminal of a paralleled inductor plus capacitor combination, in either of two opposite directions, regardless of the polarity of external lines at the second port; voltage sensors connected to the external lines; at least one current sensor connected to the inductor; wherein the controller operates the switches repeatedly to couple power into the inductor from the first port, and thereafter to isolate the inductor from all of the external lines, and thereafter to couple power out from the inductor to the second port, and thereafter to isolate the inductor again; and wherein the controller monitors voltage-current relations at one or more external lines, and indicates an islanding condition when the impedance of one of the external lines has increased detectably, and reduces power output when an islanding has occurred.

According to some but not necessarily all embodiments, there is provided: A method for islanding detection in a power-packet-switching converter, comprising: monitoring the impedance of an output terminal which is connected to the power grid; detecting an islanding condition when the impedance seen at the output terminal is lower than that of the grid; and not powering the output terminal if the islanding condition is detected.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Additional general background, which helps to show variations and implementations, may be found in the following publications, all of which are hereby incorporated by reference: U.S. Pat. No. 6,603,290; US 20120013376; US 20080204044.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Pat. No. 8,406,265, U.S. Pat. No. 8,400,800, U.S. Pat. No. 8,395,910, U.S. Pat. No. 8,391,033, U.S. Pat. No. 8,345,452, U.S. Pat. No. 8,300,426, U.S. Pat. No. 8,295,069, U.S. Pat. No. 7,778,045, U.S. Pat. No. 7,599,196, US 2012-0279567 A1, US 2012-0268975 A1, US 2012-0274138 A1, US 2013-0038129 A1, US 2012-0051100 A1; US Provisionals 61/765,098, 61/765,099, 61/765,100, 61/765,102, 61/765,104, 61/765,107, 61/765,110, 61/765,112, 61/765,114, 61/765,116, 61/765,118, 61/765,119, 61/765,122, 61/765,123, 61/765,126, 61/765,129, 61/765,131, 61/765,132, 61/765,137, 61/765,139, 61/765,144, 61/765,146 all filed Feb. 15, 2013; 61/778,648, 61/778,661, 61/778,680, 61/784,001 all filed Mar. 13, 2013; 61/814,993 filed Apr. 23, 2013; 61/817,012, 61/817,019, 61/817,092 filed Apr. 29, 2013; 61/838,578 filed Jun. 24, 2013; 61/841,618, 61/841,621, 61/841,624 all filed Jul. 1, 2013; 61/914,491 and 61/914,538 filed Dec. 11, 2013; 61/924,884 filed Jan. 8, 2014; 61/925,311 filed Jan. 9, 2014; 61/928,133 filed Jan. 16, 2014; 61/928,644 filed Jan. 17, 2014; 61/929,731 and 61/929,874 filed Jan. 21, 2014; 61/931,785 filed Jan. 27, 2014; 61/932,422 filed Jan. 28, 2014; and 61/933,442 filed Jan. 30, 2014; and all priority applications of any of the above thereof, each and every one of which is hereby incorporated by reference.

The claims as filed are intended to be as comprehensive as possible, and NO subject matter is intentionally relinquished, dedicated, or abandoned.

What is claimed is:

1. A method for islanding detection in a power converter comprising:
    making continual changes in DC power draw of a power converter which comprises a DC input and an AC output;
    sensing the AC output voltage of the converter responding to each change in the DC power draw;
    calculating a correlation product by multiplying the change in DC power draw by the corresponding change in the AC output voltage;
    summing a predetermined number of correlation products over a rolling window to produce a correlation sum; and,
    for each rolling window, detecting if the predetermined correlation sum has exceeded a predetermined threshold; and
    shutting down the power converter if the predetermined correlation sum has exceeded the predetermined threshold.

2. The method for islanding detection in a power converter of claim 1, wherein the continual changes in the DC power draw of the converter are carried out by a maximum-power point tracking method.

3. The method for islanding detection in a power converter of claim 1, wherein the number of correlation products for each rolling window is chosen so that the correlation sum exceeds a predetermined signal-to-noise ratio.

4. The method for islanding detection in a power converter of claim 1, wherein the number of correlation products is about 48.

5. The method for islanding detection in a power converter of claim 1, wherein the changes in the DC power draw of the converter are caused periodically without regard to maximum-power point tracking.

6. A power converter comprising:
    a controller;
    a first array of bidirectional switches, connecting lines of a first port to a first terminal of a paralleled inductor plus capacitor combination, in either of two opposite directions, regardless of the polarity of the external lines at the first port;
    a second array of bidirectional switches, connecting lines of a second port to a second terminal of a paralleled inductor plus capacitor combination, in either of two opposite directions, regardless of the polarity of external lines at the second port;
    voltage sensors connected to the external lines;
    at least one current sensor connected to the inductor;
    wherein the controller operates the switches repeatedly to couple power into the inductor from the first port, and thereafter to isolate the inductor from all of the external lines, and thereafter to couple power out from the inductor to the second port, and thereafter to isolate the inductor again;
    and wherein the controller monitors voltage-current relations at one or more external lines, and indicates an islanding condition when the impedance of one of the external lines has increased detectably, and reduces power output when an islanding has occurred.

7. A power converter comprising:
    a DC to AC inverter;
    a stored-program controller;
    wherein the stored-program controller executes instructions to control switches in the inverter;
    wherein the switches further control the DC current draw of the inverter and the AC output voltage of the inverter;

wherein the stored-program controller further executes instructions to:
    make continual changes in the DC power draw of the inverter;
    sense the AC output voltage of the inverter responding to each change in the DC power draw of the inverter;
    calculate a correlation product by multiplying the change in DC power draw by the corresponding change in the AC output voltage;
    sum a predetermined number of correlation products over a rolling window to produce a correlation sum; and,
    for each rolling window, detecting if the predetermined correlation sum has exceeded a threshold; and,
    if the predetermined correlation sum has exceeded the predetermined threshold, then shutting down the power converter.

8. The power converter of claim 7, further comprising:
sensors responsive to the DC current draw of the inverter; and,
sensors responsive to the AC voltage output of the inverter.

9. The power converter of claim 7, where the stored-program controller further executes instructions for a maximum-power point tracking method.

10. The power converter of claim 7, where the stored-program controller is a field-programmable gate array.

* * * * *